(12) United States Patent
Funatsu

(10) Patent No.: US 10,553,143 B2
(45) Date of Patent: Feb. 4, 2020

(54) DISPLAY APPARATUS AND ELECTRONIC APPLIANCE

(71) Applicant: SONY CORPORATION, Tokyo (JP)

(72) Inventor: Yohei Funatsu, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 15/540,657

(22) PCT Filed: Oct. 13, 2015

(86) PCT No.: PCT/JP2015/078914
§ 371 (c)(1),
(2) Date: Jun. 29, 2017

(87) PCT Pub. No.: WO2016/117181
PCT Pub. Date: Jul. 28, 2016

(65) Prior Publication Data
US 2017/0352304 A1 Dec. 7, 2017

(30) Foreign Application Priority Data

Jan. 19, 2015 (JP) ................. 2015-007539

(51) Int. Cl.
G09G 3/20 (2006.01)
G09G 3/3233 (2016.01)
(Continued)

(52) U.S. Cl.
CPC ..... *G09G 3/2003* (2013.01); *G02F 1/133514* (2013.01); *G09G 3/3233* (2013.01);
(Continued)

(58) Field of Classification Search
CPC ... G02F 1/133514; G02F 2001/136222; G02B 5/201; G02B 5/223; G02B 27/46;
(Continued)

(56) References Cited

U.S. PATENT DOCUMENTS 6,861,185 B2 * 3/2005 Tanaka ................... G02B 5/201
347/106
7,460,115 B2 * 12/2008 Asao ..................... G09G 3/3607
345/204

(Continued)

FOREIGN PATENT DOCUMENTS

JP 2003-203762 A 7/2003
JP 2013-520784 A 6/2013
(Continued)

OTHER PUBLICATIONS

International Search Report and Written Opinion of PCT Application No. PCT/JP2015/078914, dated Dec. 28, 2015, 02 pages of English Translation and 06 pages of ISRWO.

*Primary Examiner* — Dismery Mercedes
(74) *Attorney, Agent, or Firm* — Chip Law Group

(57) ABSTRACT

A display apparatus according to the present disclosure is configured in such a manner that unit pixels each constituted by a plurality of subpixels having different light emission colors are arranged in a matrix form and the subpixels having different light emission spectra of light emission colors are mixed in units of pixels or subpixels. Additionally, an electronic appliance according to the present disclosure is configured in such a manner as to include the display apparatus having the above configuration.

13 Claims, 13 Drawing Sheets

(51) Int. Cl.
  *H01L 27/32* (2006.01)
  *G02F 1/1335* (2006.01)
  *G02F 1/1362* (2006.01)

(52) U.S. Cl.
  CPC ........ *H01L 27/322* (2013.01); *H01L 27/3211* (2013.01); *G02F 2001/136222* (2013.01); *G09G 2300/0426* (2013.01); *G09G 2300/0452* (2013.01); *G09G 2320/0626* (2013.01); *G09G 2320/0666* (2013.01); *G09G 2330/023* (2013.01); *G09G 2360/16* (2013.01)

(58) Field of Classification Search
  CPC .............. G02B 27/322; H01L 27/3211; H01L 27/3213; H01L 27/322; H01L 27/3206; G09G 2300/0452; G09G 2320/0666; G09G 3/3233; G09G 3/2003; G09G 3/3225
  See application file for complete search history.

(56) References Cited

U.S. PATENT DOCUMENTS

| | | | | |
|---|---|---|---|---|
| 7,480,018 | B2* | 1/2009 | Takizawa | G02F 1/133512 349/106 |
| 8,085,366 | B2* | 12/2011 | Chang | G02F 1/133514 349/106 |
| 9,123,669 | B2* | 9/2015 | Fujino | H01L 27/322 |
| 9,293,096 | B2* | 3/2016 | Kouno | G09G 3/3648 |
| 9,482,797 | B2* | 11/2016 | Peng | H01L 27/14621 |
| 10,324,239 | B2* | 6/2019 | Takeda | G02F 1/133512 |
| 2003/0128310 | A1 | 7/2003 | Takizawa | G02F 1/133512 349/106 |
| 2006/0214596 | A1* | 9/2006 | Miller | G09G 3/3233 315/169.3 |
| 2007/0090751 | A1* | 4/2007 | Cok | H01L 27/3213 313/501 |
| 2007/0153165 | A1* | 7/2007 | Hu | G02F 1/133514 349/106 |
| 2008/0224604 | A1* | 9/2008 | Satou | H01L 27/3211 313/504 |
| 2009/0021534 | A1* | 1/2009 | Tomizawa | G09G 3/2003 345/690 |
| 2009/0051627 | A1* | 2/2009 | Ihata | G09G 3/3208 345/76 |
| 2009/0200451 | A1* | 8/2009 | Conners | H04N 5/2351 250/208.1 |
| 2010/0133538 | A1* | 6/2010 | Chang | G02F 1/133514 257/59 |
| 2010/0225673 | A1* | 9/2010 | Miller | G09G 3/2003 345/690 |
| 2013/0127923 | A1* | 5/2013 | An | G09G 5/10 345/690 |
| 2013/0161595 | A1* | 6/2013 | Kim | H01L 27/3216 257/40 |
| 2014/0055330 | A1* | 2/2014 | Park | G09G 3/2003 345/88 |
| 2014/0231790 | A1* | 8/2014 | Fujino | H01L 27/322 257/40 |
| 2015/0014655 | A1* | 1/2015 | Yun | H01L 33/508 257/40 |
| 2015/0243712 | A1* | 8/2015 | Wang | H01L 27/3227 257/40 |
| 2015/0340410 | A1* | 11/2015 | Hack | H01L 51/5265 257/40 |
| 2016/0163249 | A1* | 6/2016 | Yata | G09G 3/2003 345/694 |
| 2017/0221196 | A1* | 8/2017 | Yamaguchi | G06F 3/044 |

FOREIGN PATENT DOCUMENTS

| | | |
|---|---|---|
| JP | 2014-154354 A | 8/2014 |
| JP | 2014-186257 A | 10/2014 |

\* cited by examiner

FIG. 6A

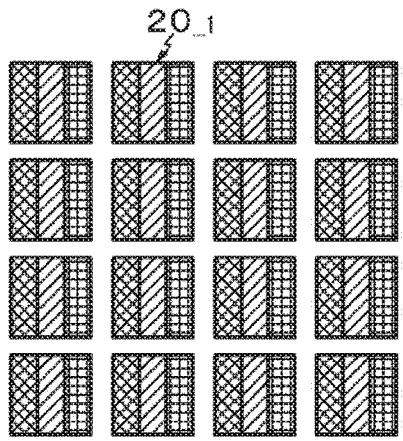

| WITH COLOR FILTERS | | |
|---|---|---|
| COLOR GAMUT sRGB COVERAGE | BRIGHTNESS RATIO UNDER SAME CONDITIONS ON CURRENT | ELECTRIC POWER RATIO UNDER SAME CONDITIONS ON BRIGHTNESS |
| 150 [%] | 100 [%] | 100 [%] |

FIG. 6B

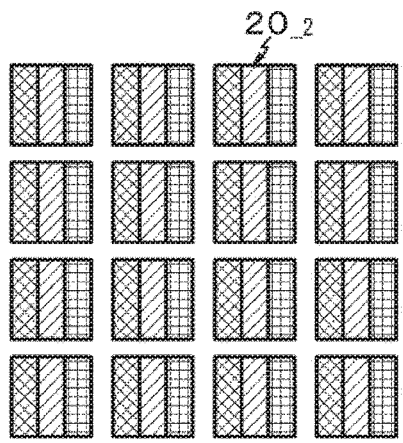

| WITHOUT COLOR FILTERS | | |
|---|---|---|
| COLOR GAMUT sRGB COVERAGE | BRIGHTNESS RATIO UNDER SAME CONDITIONS ON CURRENT | ELECTRIC POWER RATIO UNDER SAME CONDITIONS ON BRIGHTNESS |
| 100 [%] | 150 [%] | 67 [%] |

FIG. 6C

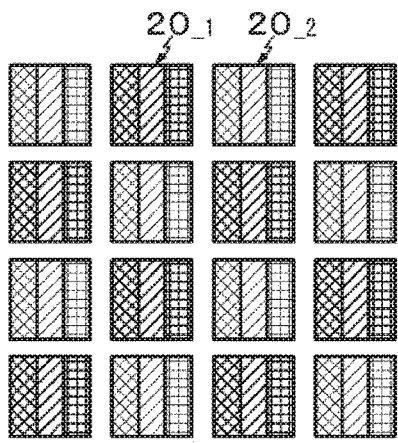

| MIXTURE CASE WITH AND WITHOUT COLOR FILTERS | | |
|---|---|---|
| COLOR GAMUT sRGB COVERAGE | BRIGHTNESS RATIO UNDER SAME CONDITIONS ON CURRENT | ELECTRIC POWER RATIO UNDER SAME CONDITIONS ON BRIGHTNESS |
| 150 [%] | 125 [%] | 80 [%] |

FIG. 10
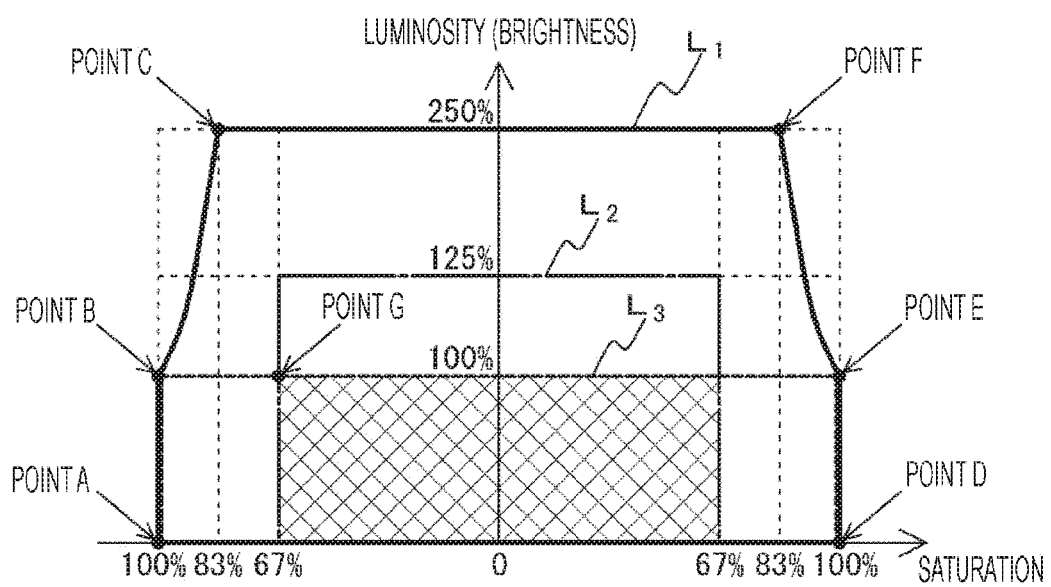
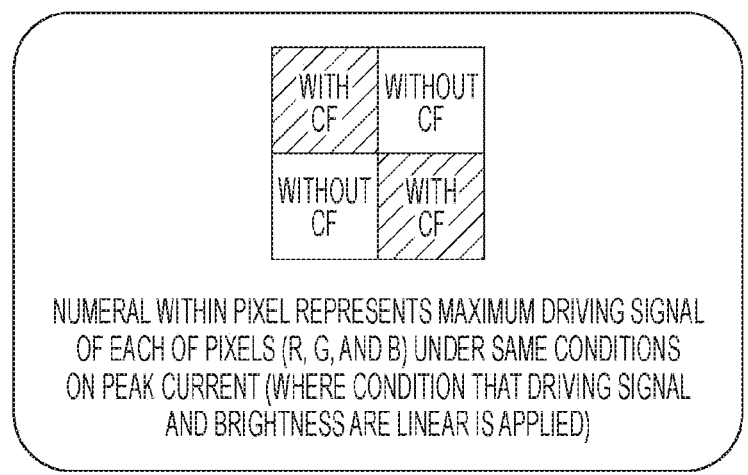
NUMERAL WITHIN PIXEL REPRESENTS MAXIMUM DRIVING SIGNAL
OF EACH OF PIXELS (R, G, AND B) UNDER SAME CONDITIONS
ON PEAK CURRENT (WHERE CONDITION THAT DRIVING SIGNAL
AND BRIGHTNESS ARE LINEAR IS APPLIED)

OPTIMIZING DESIGN CAN BE IMPLEMENTED INDIVIDUALLY
IN CONSIDERATION OF USAGE AND INPUT VIDEO SIGNAL

DISPLAY APPARATUS AND ELECTRONIC APPLIANCE

CROSS REFERENCE TO RELATED APPLICATIONS

This application is a U.S. National Phase of International Patent Application No. PCT/JP2015/078914 filed on Oct. 13, 2015, which claims priority benefit of Japanese Patent Application No. JP 2015-007539 filed in the Japan Patent Office on Jan. 19, 2015. Each of the above-referenced applications is hereby incorporated herein by reference in its entirety.

TECHNICAL FIELD

The present disclosure relates to a display apparatus and an electronic appliance.

BACKGROUND ART

In order to realize color display, a color filter functions as one of important components in a liquid crystal display apparatus. Also in the case of an organic electro-luminescence (EL) display apparatus using an organic EL element serving as a self light-emitting element, the color filter is used for the purpose of preventing the reflection of light from outside at the organic EL element and a wiring electrode located between the elements and enhancing color purity (for example, refer to Patent Document 1).

However, when the color filter is arranged at a pixel in the organic EL display apparatus, light use efficiency is degraded. Additionally, increasing the density of the color filter in order to achieve a wide color gamut degrades brightness. This means that the color gamut (color reproduction region) and the brightness have a trade-off relationship.

CITATION LIST

Patent Document

Patent Document 1: Japanese Patent Application Laid-Open No. 2003-203762

SUMMARY OF THE INVENTION

Problems to be Solved by the Invention

Typically, in order to achieve both of the high brightness and the wide color gamut in a display apparatus such as the organic EL display apparatus, causing a light source (light-emitting unit) to emit light at high brightness is considered. However, power consumption of the display apparatus is increased when the light source emits light at high brightness.

Taking this situation into account, an object of the present disclosure is to provide a display apparatus and an electronic appliance including the display apparatus capable of achieving both of the high brightness and the wide color gamut having a trade-off relationship while avoiding an increase in power consumption.

Solutions to Problems

A display apparatus according to the present disclosure to attain the above-mentioned object is configured in such a manner that unit pixels each constituted by a plurality of subpixels having different light emission colors are arranged in a matrix form, and the subpixels having different light emission spectra of light emission colors are mixed in units of pixels or subpixels.

Also, an electronic appliance according to the present disclosure to attain the above-mentioned object is configured in such a manner as to include the display apparatus having the above configuration.

In the display apparatus having the above configuration or the electronic appliance including the display apparatus, because the subpixels having different light emission spectra of light emission colors are mixed, it is made possible to drive the plurality of subpixels having different light emission colors while drive ratio therebetween is varied. Here, a state where the subpixels having different light emission spectra of light emission colors are mixed represents that the subpixels having relatively high-intensity light emission spectra of light emission colors and the subpixels having relatively low-intensity light emission spectra of light emission colors are mixed. Accordingly, when the subpixels having relatively high-intensity light emission spectra of light emission colors are mainly driven to emit light, the high brightness can be achieved. On the other hand, when the subpixels having relatively low-intensity light emission spectra of light emission colors are mainly driven to emit light, the wide color gamut can be achieved.

Effects of the Invention

According to the present disclosure, the subpixels having different light emission spectra of light emission colors are mixed and consequently, driving to achieve both of the high brightness and the wide color gamut having a trade-off relationship can be realized.

Note that the effects are not necessarily limited the ones described herein and any effects described in the present description may be applied. In addition, the effects described in the present description merely serve as examples and the effects are not construed to be limited thereto. There may be an additional effect as well.

BRIEF DESCRIPTION OF DRAWINGS

FIGS. 6A, 6B and 6C are diagrams illustrating comparison results between a color gamut, brightness, and electric power worked out through desktop calculations: FIG. 6A illustrates a case where the color filters are disposed in all pixels, FIG. 6B illustrates a case where the color filters are not disposed in any pixels, and FIG. 6C illustrates a case where the color filters are arranged in the checker pattern.

FIG. 10 is a conceptual diagram of the extension of the saturation and the brightness.

FIG. 11A illustrates the light emission states of the respective pixels at a point C on a solid line L1 in FIG. 10, FIG. 11B illustrates the light emission states of the respective pixels at a point B on the line, and FIG. 11C illustrates the light emission states of the respective pixels at a point G located in an inner area of the line.

FIG. 12A illustrates a first example and FIG. 12B illustrates a second example.

MODE FOR CARRYING OUT THE INVENTION

Figure 1:
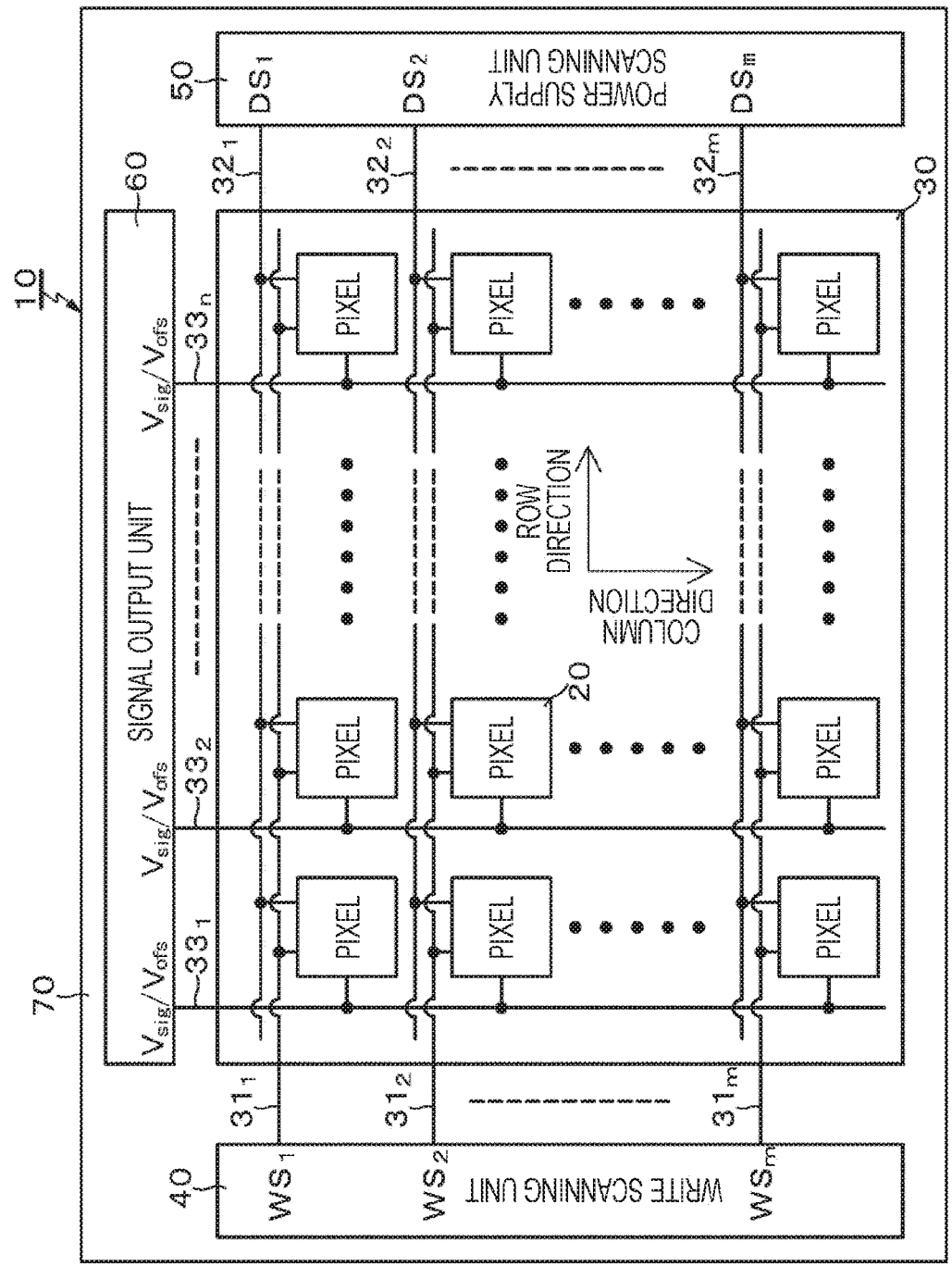
FIG. 1 is a schematic system configuration diagram illustrating a fundamental configuration of an active matrix type organic EL display apparatus serving as a basic concept of the present disclosure.

Modes for carrying out a technology according to the present disclosure (hereinafter, stated as "embodiments") will be described below in detail with reference to the drawings. The technology according to the present disclosure is not limited to the embodiments and various numerical values, materials and the like used in the embodiments serve as examples. In the following description, the same reference numerals will be used for the same elements or elements having the same functions and duplicated description will be omitted. Note that the description will be given in the following order.

1. Description of Display Apparatus and Electronic Appliance according to Present Disclosure and Overall Description 2. Display Apparatus as Basic Concept of Present Disclosure 2-1. System Configuration 2-2. Pixel Circuit 2-3. Color Filter 3. Embodiment of Present Disclosure 3-1. Color Coding for Color Filter 3-2. Signal Processing Algorithm 3-3. Actions and Effects of Embodiment 4. Variations 5. Electronic Appliance <Description of Display Apparatus and Electronic Appliance according to Present Disclosure and Overall Description>

A display apparatus according to the present disclosure is a color display apparatus configured in such a manner that unit pixels each constituted by a plurality of subpixels having different light emission colors are arranged in a matrix form. One pixel in the color display apparatus is made up of three subpixels, namely, a red light-emitting subpixel configured to emit light in red, a green light-emitting subpixel configured to emit light in green, and a blue light-emitting subpixel configured to emit light in blue, or alternatively, made up of four or more subpixels.

In the color display apparatus configured as described above, the red light-emitting subpixel may be constituted by a light-emitting element that emits red light, the green light-emitting subpixel may be constituted by a light-emitting element that emits green light, and the blue light-emitting subpixel may be constituted by a light-emitting element that emits blue light. In addition, a configuration including a color filter may be employed and the light-emitting element may be configured to emit white light such that each of the light-emitting subpixels of respective colors is constituted by a combination of the light-emitting element that emits white light and the color filter.

In the case of a mode in which one pixel (or one subpixel) is constituted by one light-emitting element, examples of arrays of the pixels (or the subpixels) include, but are not limited to, a stripe array, a diagonal array, a delta array, and a rectangular array. Meanwhile, in the case of a mode in which the plurality of light-emitting elements is collected to constitute one pixel (or one subpixel), examples of the arrays of the pixels (or the subpixels) include, but are not limited to, a stripe array.

The display apparatus and the electronic appliance according to the present disclosure can be configured in such a manner that the plurality of subpixels includes the color filters and the optical density of the color filters differs from pixel to pixel or from subpixel to subpixel. Using the different optical density among the color filters here means that the light transmittance and transmission spectra of the color filters differ thereamong. Additionally, this means that the color filter having increased optical density is a color filter with low light transmittance and a weak transmission spectrum (low intensity), while the color filter having decreased optical density is a color filter with high light transmittance and a strong transmission spectrum (high intensity).

In the display apparatus and the electronic appliance according to the present disclosure including the above-described preferable configuration, the display apparatus can be configured as an organic EL display apparatus in which the plurality of subpixels has light-emitting units (light-emitting elements) constituted by organic electro-luminescence elements (organic EL elements). That is, the subpixel is constituted by each of the organic EL elements in the organic EL display apparatus.

The organic EL display apparatus, for example, can be used as a monitor apparatus constituting a personal computer, a video camera, a digital still camera or can be used as a monitor apparatus built into a television receiver, a portable telephone, a personal digital assistant (PDA), game equipment. Alternatively, the organic EL display apparatus can be applied to an electronic view finder (EVF) and a head-mounted Display (HMD). Alternatively, a backlight apparatus for a liquid crystal display apparatus and an illumination apparatus including a plane light source apparatus are considered as other examples.

In the organic EL element, an organic layer serving as a light-emitting function layer includes a light-emitting layer (for example, a light-emitting layer constituted by an organic light-emitting material). Specifically, this organic layer can be constituted by, for example, a laminated structure made up of a hole transport layer, the light-emitting layer, and an electron transport layer, or a laminated structure made up of the hole transport layer and the light-emitting layer also functioning as the electron transport layer, or a laminated structure made up of a hole injection layer, the hole transport layer, the light-emitting layer, the electron transport layer, and an electron injection layer or the like. In addition, in a case where these laminated structures or the like are configured as tandem units, the organic layer may have a two-layer tandem structure in which a first tandem unit, a connection layer, and a second tandem unit are laminated. Furthermore, the organic layer may have a three or more-layer tandem structure in which three or more tandem units are laminated. In these cases, the light emission colors are differentiated into red, green, and blue between the respective tandem units, whereby the organic layer that emits light in white can be obtained as a whole.

Examples of formation methods for the organic layer include physical vapor deposition (PVD) such as vacuum deposition; a printing method such as screen printing and inkjet printing; a laser transfer method in which the laminated structure made up of a laser-absorbing layer and the organic layer is formed on a transfer substrate to be irradiated with a laser beam such that the organic layer is separated from the laser-absorbing layer and then the organic layer is transferred; and various types of coating methods. In a case where the organic layer is formed on the basis of the vacuum deposition, the organic layer can be obtained, for example, using a so-called metal mask in such a manner that materials passing through an opening provided on the metal mask are deposited, alternatively, the organic layer may be formed on the entire surface without patterning.

When the plurality of subpixels has the light-emitting units constituted by the organic EL elements, the display apparatus and the electronic appliance according to the present disclosure including the above-described preferable configuration can be configured in such a manner that the plurality of subpixels includes the color filters and the optical density of the color filters differs from pixel to pixel or from subpixel to subpixel. Alternatively, a configuration can be employed in which the subpixels with the color filters and the subpixels without the color filters are mixed in units of pixels or subpixels. At this time, the subpixels with the color filters can be configured in such a manner that the optical density of the color filters differs from pixel to pixel or from subpixel to subpixel.

Additionally, when the plurality of subpixels has the light-emitting units constituted by the organic EL elements, the display apparatus and the electronic appliance according to the present disclosure including the above-described preferable configuration can be configured in such a manner that the light emission spectra of light emitting from the light-emitting layers of the organic EL elements differ from pixel to pixel or from subpixel to subpixel. At this time, the plurality of subpixels can be configured in such a manner that a thickness of the organic layer including the light-emitting layer differs between the subpixels having the same light emission color in units of pixels or subpixels and alight emission color having a different light emission spectrum is obtained through multiple-beam interference between two electrodes sandwiching the organic layer.

Additionally, the display apparatus and the electronic appliance according to the present disclosure including the above-described preferable configuration can be configured in such a manner as to have a signal processing circuit that carries out signal processing on video signals driving the plurality of subpixels having different light emission colors by regarding the plurality of unit pixels each including the subpixels having different light emission spectra of light emission colors as one signal processing unit. The signal processing circuit controls a drive ratio between the subpixels having different light emission spectra of light emission colors. The signal processing circuit also calculates the drive ratio on the basis of information on brightness or luminosity and information on saturation of the respective unit pixels obtained from the video signals driving the plurality of subpixels having different light emission colors. More specifically, the drive ratio is calculated on the basis of average brightness or average luminosity and average saturation of the plurality of unit pixels.

Additionally, in the display apparatus and the electronic appliance according to the present disclosure including the above-described preferable configuration, the drive ratio is assumed as K, maximum brightness of the subpixel having a relatively strong light emission spectrum is assumed as $L_a$, and maximum brightness of the subpixel having a relatively weak light emission spectrum is assumed as $L_b$. At this time, the signal processing circuit can be configured in such a manner as to carry out the signal processing by multiplying the video signal driving the subpixel by (1.0−K) in the case of the subpixel having a relatively weak light emission spectrum and carryout the signal processing by multiplying the video signal driving the subpixel by ($K \times L_b/L_a$) in the case of the subpixel having a relatively strong light emission spectrum.

<Display Apparatus as Basic Concept of Present Disclosure>

[System Configuration]

FIG. 1 is a schematic system configuration diagram illustrating a fundamental configuration of an active matrix type organic EL display apparatus serving as a basic concept of the present disclosure.

An active matrix type display apparatus is a display apparatus configured to drive the light-emitting unit (light-emitting element) through an active element such as an insulated gate type field effect transistor provided within the same pixel as the light-emitting unit. A thin film transistor (TFT) can be used as a representative example of the insulated gate type field effect transistor.

The organic EL display apparatus according to an active matrix approach in which the light-emitting unit (light-emitting element) of the unit pixel (pixel circuit) is constituted by the organic EL element will be described here as an exemplary case. The organic EL element is an electro-optical element of a current drive type whose light emission brightness varies depending on the value of a current flowing in a device. Hereinafter, "unit pixel/pixel circuit" will be simply stated as "pixel" in some cases.

As illustrated in FIG. 1, the active matrix type organic EL display apparatus 10 serving as a basic concept of the present disclosure has a configuration including a pixel array section 30 constituted by a plurality of unit pixels 20 two-dimensionally arranged in a matrix form (two-dimensional matrix form) and a driving unit (peripheral circuit) arranged in a peripheral area of the pixel array section 30 to drive the pixels 20. The driving unit is constituted by, for example, a write scanning unit 40, a power supply scanning unit 50, a signal output unit 60 and the like, and drives the respective pixels 20 in the pixel array section 30.

In this example, the write scanning unit 40, the power supply scanning unit 50, and the signal output unit 60 are mounted on the same substrate as the pixel array section 30, namely, a display panel 70 as the peripheral circuit of the pixel array section 30. However, a configuration in which some or all of the write scanning unit 40, the power supply scanning unit 50, and the signal output unit 60 are provided at the outside of the display panel 70 can be also adopted. In addition, although each of the write scanning unit 40 and the power supply scanning unit 50 are arranged on one side of the pixel array section 30 in this configuration, a configuration to arrange each unit on both sides so as to sandwich the pixel array section 30 can be also adopted. A transparent insulating substrate such as a glass substrate can be used as the substrate for the display panel 70, or alternatively, a semiconductor substrate such as a silicon substrate can be also used.

In the organic EL display apparatus 10 supporting color display, one pixel (unit pixel) that functions as a unit when a color image is formed is made up of the subpixels of a plurality of colors. In this configuration, each of the subpixels corresponds to the pixel 20 in FIG. 1. More specifically, one pixel in the display apparatus supporting color display is made up of, for example, three subpixels, namely, the subpixel that emits red light (R), the subpixel that emits green light (G), and the subpixel that emits blue light (B).

However, the combination of the subpixels for one pixel is not limited to three primary colors of RGB. It is also possible to configure one pixel by further adding the subpixel of one color or the subpixels of a plurality of colors to the subpixels of the three primary colors. More specifically, for example, it is also possible to configure one pixel by adding the subpixel that emits white light (W) in order to enhance the brightness, or alternatively, configure one pixel by adding at least one subpixel that emits light in a complementary color in order to enlarge a color reproduction range.

In the pixel array section 30, scan lines 31 ($31_1$ to $31_m$) and power supply lines 32 ($32_1$ to $32_m$) are individually wired for respective pixel rows in an array of the pixels 20 of m rows and n columns, along a row direction (an array direction of the pixels in the pixel rows or a horizontal direction thereof). Additionally, signal lines 33 ($33_1$ to $33_n$) are individually wired for respective pixel columns in the array of the pixels 20 of m rows and n columns, along a column direction (an array direction of the pixels in the pixel columns or a vertical direction thereof).

The scan lines $31_1$ to $31_m$ are individually connected to respective output terminals of the write scanning unit 40 at corresponding rows. The power supply lines $32_1$ to $32_m$ are individually connected to respective output terminals of the power supply scanning unit 50 at corresponding rows. The signal lines $33_1$ to $33_n$ are individually connected to respective output terminals of the signal output unit 60 at corresponding columns.

The write scanning unit 40 is constituted by a shift resister circuit or the like. When writing signal voltages of the video signals to the respective pixels 20 in the pixel array section 30, this write scanning unit 40 carries out so-called line sequential scanning in which write scan signals WS ($WS_1$ to $WS_m$) are sequentially supplied to the scan lines 31 ($31_1$ to $31_m$) such that the respective pixels 20 in the pixel array section 30 are scanned in order in units of rows.

The power supply scanning unit 50 is constituted by a shift resister circuit or the like similarly to the write scanning unit 40. In synchronization with the line sequential scanning by the write scanning unit 40, this power supply scanning unit 50 supplies, to the power supply lines 32 ($32_1$ to $32_m$), power supply voltages DS ($DS_1$ to $DS_m$) that can be switched between a first power supply voltage $V_{ccp}$ and a second power supply voltage $V_{ini}$ lower than the first power supply voltage $V_{ccp}$. As described later, light emission and non-light emission (quenching) of the pixel 20 are controlled through the switching of the power supply voltage DS between $V_{ccp}$ and $V_{ini}$.

The signal output unit 60 selectively outputs a signal voltage $V_{sig}$ of the video signal supplied from a signal supply source (not illustrated) in accordance with brightness information (hereinafter, simply stated as "signal voltage" in some cases) and a reference voltage $V_{ofs}$. The reference voltage $V_{ofs}$ here represents a voltage functioning as a reference for the signal voltage $V_{sig}$ of the video signal (for example, a voltage corresponding to a black level of the video signal) and is used in threshold correction processing described later.

The signal voltage Vsig and the reference voltage Vofs output from the signal output unit 60 are written to the respective pixels 20 in the pixel array section 30 via the signal lines 33 (331 to 33n) in units of pixel row selected through the scanning by the write scanning section 40. In other words, a driving mode of line sequential writing in which the signal voltage Vsig is written in units of rows (lines) is adopted in the signal output unit 60.

[Pixel Circuit]

Figure 2:
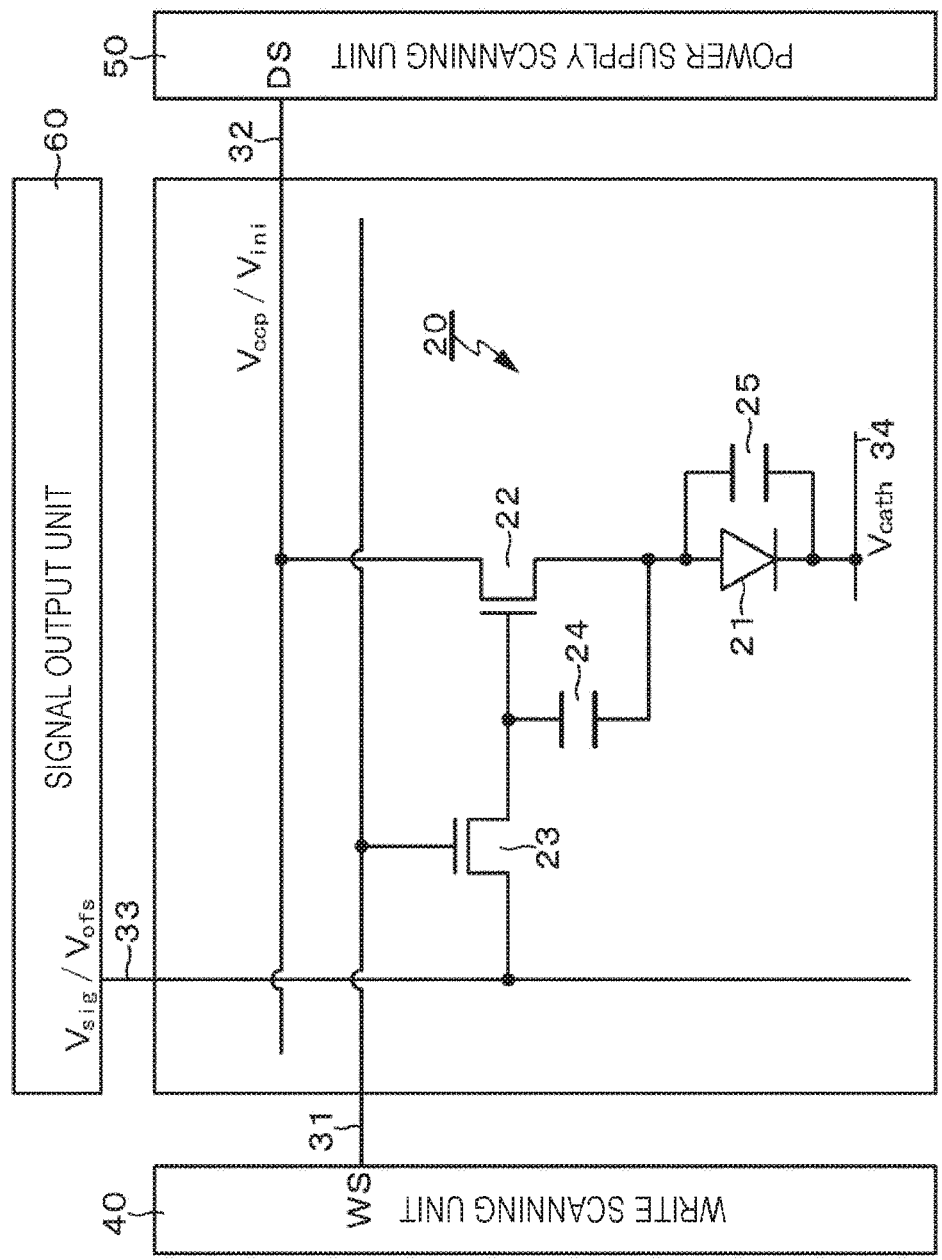
FIG. 2 is a circuit diagram illustrating a circuit configuration of a unit pixel (pixel circuit) constructed as 2Tr2C.

FIG. 2 is a circuit diagram illustrating a specific example of a circuit configuration of the unit pixel (pixel circuit) 20. The light-emitting unit of the pixel 20 is constituted by an organic EL element 21 serving as an example of an electro-optical element of a current drive type whose light emission brightness varies depending on the value of a current flowing in a device.

As illustrated in FIG. 2, the pixel 20 is constituted by the organic EL element 21 and a drive circuit configured to drive the organic EL element 21 through a current flowing into the organic EL element 21. A cathode electrode of the organic EL element 21 is connected to a common power line 34 commonly wired for all of the pixels 20.

The drive circuit configured to drive the organic EL element 21 has a drive transistor 22, a write transistor 23, a storage capacitor 24, and an auxiliary capacitor 25, that is, employs a 2Tr2C circuit configuration including two transistors (Tr) and two capacitive elements (C). N-channel type thin film transistors (TFTs) are used here as the drive transistor 22 and the write transistor 23. However, a combination of a conductive type of the drive transistor 22 and the write transistor 23 indicated here merely serve as an example and the combination is not limited to the one made up of these transistors.

In the drive transistor 22, one electrode (source/drain electrode) is connected to the power supply line 32 (one of $32_1$ to $32_m$), whereas another electrode (source/drain electrode) is connected to an anode electrode of the organic EL element 21. In the write transistor 23, one electrode (source/drain electrode) is connected to the signal line 33 (one of $33_1$ to $33_n$), whereas another electrode (source/drain electrode) is connected to agate electrode of the drive transistor 22. Meanwhile, a gate electrode of the write transistor 23 is connected to the scan line 31 (one of $31_1$ to $31_m$).

In the drive transistor 22 and the write transistor 23, the one electrode represents a metal line electrically connected to one source/drain area and the another electrode represents a metal line electrically connected to another source/drain area. In addition, depending on the relation of electric potentials between the one electrode and the another electrode, the one electrode functions as a source electrode while the another electrode functions as a drain electrode in some cases and, in other cases, the one electrode functions as a drain electrode while the another electrode functions as a source electrode.

In the storage capacitor 24, one electrode is connected to the gate electrode of the drive transistor 22, whereas another electrode is connected to the another electrode of the drive transistor 22 and the anode electrode of the organic EL element 21. In the auxiliary capacitor 25, one electrode is connected to the anode electrode of the organic EL element 21 and another electrode is connected to the cathode electrode of the organic EL element 21, respectively. In short, the auxiliary capacitor 25 is connected to the organic EL element 21 in parallel.

According to the above-described configuration, an electrical connection is produced in the write transistor 23 in response to the write scan signal WS that activates a high voltage state when applied to the gate electrode of the write transistor 23 from the write scanning unit 40 by way of the scan line 31. In line with this, the write transistor 23 samples the signal voltage $V_{sig}$ of the video signal in accordance with the brightness information or the reference voltage $V_{ofs}$, the voltages being supplied from the signal output unit 60 by way of the signal line 33 at different timings, and then writes a resultant voltage within the pixel 20. The signal voltage $V_{sig}$ or the reference voltage $V_{ofs}$ written by the write transistor 23 is stored to the storage capacitor 24.

In a case where the power supply voltage DS at the power supply lines 32 ($32_1$ to $32_m$) is set at the first power supply voltage $V_{ccp}$, each of the drive transistors 22 works in a saturation region in such a manner that the one electrode functions as the drain electrode and the another electrode functions as the source electrode. In this state, upon receiving a current supply from the power supply line 32, the drive transistor 22 drives the organic EL element 21 such that light is emitted therefrom through current driving. More specifically, while working in the saturation region, the drive transistor 22 supplies, to the organic EL element 21, a drive current at a current value in accordance with a voltage value of the signal voltage $V_{sig}$ stored in the storage capacitor 24, thereby driving the organic EL element 21 by current such that light is emitted therefrom.

Additionally, when the power supply voltage DS is switched to the second power supply voltage $V_{ini}$ from the first power supply voltage $V_{ccp}$, the one electrode functions as the source electrode and the another electrode functions as the drain electrode, whereby the drive transistor 22 acts as a switching transistor. In this state, the drive transistor 22 stops to supply the drive current to the organic EL element 21, thereby putting the organic EL element 21 into a non-light emission state. In other words, the drive transistor 22 also has a function as a transistor controlling light emission and non-light emission of the organic EL element 21.

This switching action of the drive transistor 22 makes it possible to provide a time period during which the organic EL element 21 stays in the non-light emission state (non-light emission period) and then control percentages of a light emission period and the non-light emission period (duty) of the organic EL element 21. Because this duty control can reduce afterimage blur caused by light emission of the pixel during an entire one display frame period, an excellent quality of a moving image can be achieved in particular.

Among the first and second power supply voltages $V_{ccp}$ and $V_{ini}$ selectively supplied from the power supply scanning unit 50 by way of the power supply line 32, the first power supply voltage $V_{ccp}$ functions as the power supply voltage used to supply the drive current to the drive transistor 22 such that the organic EL element 21 is driven to emit light. Meanwhile, the second power supply voltage $V_{ini}$ functions as the power supply voltage used to apply an inverse bias to the organic EL element 21. This second power supply voltage $V_{ini}$ is set to a voltage lower than the reference voltage $V_{ofs}$, for example, a voltage lower than $V_{ofs}-V_{th}$ when a threshold voltage of the drive transistor 22 is assumed as $V_{th}$, and preferably, set to a voltage sufficiently lower than $V_{ofs}-V_{th}$.

Each of the pixels 20 in the pixel array section 30 has a function to correct variations in the drive currents resulted from variations in characteristics of the drive transistor 22. Examples of the characteristics of the drive transistor 22 include the threshold voltage $V_{th}$ of the drive transistor 22 and mobility u of a semiconductor thin film constituting a channel of the drive transistor 22 (hereinafter, simply stated as "mobility u of the drive transistor 22").

Correction of variations in the drive currents resulted from variations in the threshold voltages $V_{th}$ (hereinafter, stated as "threshold correction") is made by initializing a gate voltage $V_g$ of the drive transistor 22 to the reference voltage $V_{ofs}$. Specifically, an action is taken to vary a source voltage $V_s$ of the drive transistor 22 toward an electric potential obtained by subtracting the threshold voltage $V_{th}$ of the drive transistor 22 from an initialization voltage, using the initialization voltage of the gate voltage $V_g$ of the drive transistor 22 (reference voltage $V_{ofs}$) as a reference. When this action proceeds and then is completed, a gate-source voltage $V_{gs}$ of the drive transistor 22 converges to the threshold voltage $V_{th}$ of the drive transistor 22. This voltage corresponding to the threshold voltage $V_{th}$ is stored to the storage capacitor 24. Accordingly, because the voltage corresponding to the threshold voltage $V_{th}$ is stored in the storage capacitor 24, dependency of a drain-source current $I_{ds}$ flowing in the drive transistor 22 on the threshold voltage $V_{th}$ can be suppressed while the drive transistor 22 is driven by the signal voltage $V_{sig}$ of the video signal.

Meanwhile, correction of variations in the drive currents resulted from variations in the mobility u (hereinafter, stated as "mobility correction") is made by flowing a current to the storage capacitor 24 via the drive transistor 22 while the write transistor 23 is writing the signal voltage $V_{sig}$ of the video signal after being electrically connected. In different words, the mobility correction is made by applying negative feedback to the storage capacitor 24 by an amount of feedback (amount of correction) in accordance with the current $I_{ds}$ flowing in the drive transistor 22. The dependency of the drain-source current $I_{ds}$ on the threshold voltage $V_{th}$ is already canceled through the above-described threshold correction by the time the video signal is written and thus, the drain-source current $I_{ds}$ now depends on the mobility u of the drive transistor 22. Accordingly, by applying negative feedback to a drain-source voltage $V_{ds}$ at the drive transistor 22 by an amount of feedback in accordance with the current $I_{ds}$ flowing in the drive transistor 22, the dependency of the drain-source current $I_{ds}$ flowing in the drive transistor 22 on the mobility u can be suppressed.

[Color Filter]

Figure 3A:
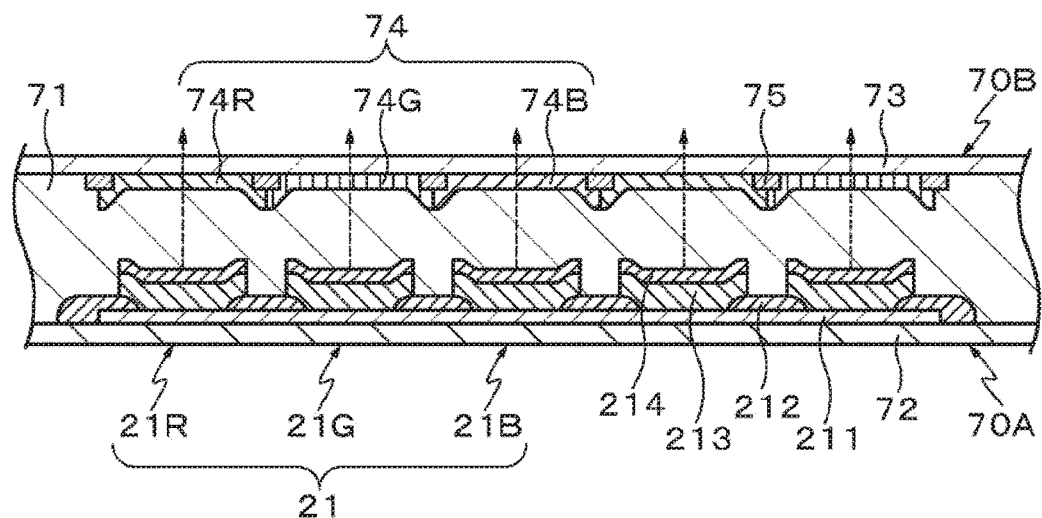
FIG. 3A is an overall cross-sectional view illustrating an exemplary structure of a display panel with a color filter.

In the above-described organic EL display apparatus 10 configured in such a manner that the unit pixels 20 each constituted by the plurality of subpixels having different light emission colors are arranged in a matrix form, the color filter is used for the purpose of preventing the reflection of light from outside at the organic EL element 21 and a wiring electrode located between the elements and enhancing color purity. An exemplary structure of the display panel with the color filter will be described hereinafter with reference to FIGS. 3A and 3B. FIG. 3A is an overall cross-sectional view of the display panel, whereas FIG. 3B is an enlarged cross-sectional view of the organic EL element 21.

As illustrated in FIG. 3A, the display panel 70 (refer to FIG. 1) has a panel structure in which, for example, a drive panel 70A and a sealing panel 70B are arranged so as to oppose each other and affixed to each other throughout the entire surfaces with an adhesive layer 71 interposed therebetween. For example, the drive panel 70A is configured in such a manner that an organic EL element 21R that emits red light (R), an organic EL element 21G that emits green light (G), and an organic EL element 21B that emits blue light (B) are placed in order on a drive substrate 72 made of an insulation material such as glass so as to form a matrix as a whole.

Figure 3B:
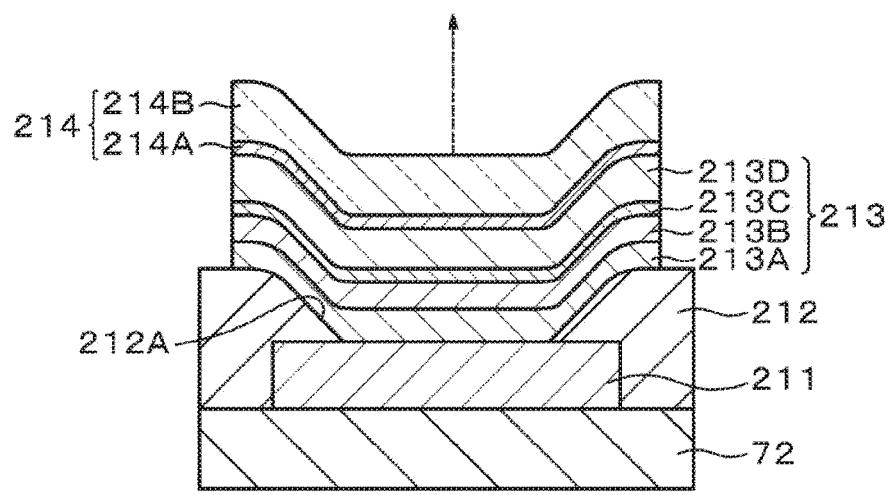
FIG. 3B is an enlarged cross-sectional view of an organic EL element.

As illustrated in FIG. 3B, for example, each of the organic EL elements 21R, 21G, and 21B has a structure obtained by laminating an anode 211 serving as a first electrode, an insulating layer 212, an organic layer 213, and a cathode 214 serving as a second electrode in this order from a side of the drive substrate 72. The anode 211 and the cathode 214 have a function to supply a current to the organic EL elements 21R, 21G, and 21B.

The anode 211 is made of metal such as platinum (Pt), gold (Au), silver (Ag), chromium (Cr), and tungsten (W) or an alloy thereof. The insulating layer 212 ensures an insulation characteristic between the anode 211 and the cathode 214 and at the same time, is used to form a shape of a light emission area at each of the organic EL elements 21R, 21G, and 21B into a desired shape. The insulating layer 212 is made of an insulation material such as silicon dioxide ($SiO_2$) and provided with an opening portion 212A corresponding to the light emission area.

The organic layer 213 serving as a light-emitting function layer has a structure obtained by laminating a hole injection layer 213A, a hole transport layer 213B, a light-emitting layer 213C, and an electron transport layer 213D each made of an organic material, in this order from a side of the anode 211. The hole injection layer 213A and the hole transport layer 213B are used to enhance the efficiency of hole injection to the light-emitting layer 213C. The light-emitting layer 213C emits light when the current flows thereinto and configured to emit light at an area corresponding to the opening portion 212A of the insulating layer 212. The electron transport layer 213D is used to enhance the efficiency of electron injection to the light-emitting layer 213C.

The cathode 214 has a structure obtained by laminating a semi-transmissive electrode 214A having a semi-transmissive characteristic with respect to light generated at the light-emitting layer 213C and a transparent electrode 214B having a transmissive characteristic with respect to light generated at the light-emitting layer 213C, in this order from a side of the organic layer 213. With this configuration, as indicated by dashed line arrows in FIGS. 3A and 3B, the light generated at the light-emitting layer 213C can be taken out from a side of the cathode 214 in the drive panel 70A.

The semi-transmissive electrode 214A is used to reflect the light generated at the light-emitting layer 213C with respect to the anode 211 and, for example, made of an alloy of magnesium (Mg) and silver (Mg—Ag alloy). That is, the semi-transmissive electrode 214A and the anode 211 form a resonator to resonate the light generated at the light-emitting layer 213C.

With this resonator structure, the light generated at the light-emitting layer 213C causes multiple interference, which acts as a sort of narrow-band filter. With this, a half width of the light emission spectrum of the light to be taken out decreases and the color purity can be enhanced. In addition, light from outside entering from the sealing panel 70B also can be attenuated though the multiple interference.

Besides, when this resonator structure and a color filter 74 described later (refer to FIG. 3A) are combined, a significantly lower reflectance of light from outside can be achieved at the organic EL elements 21R, 21G, and 21B.

The transparent electrode 214B is used to decrease electrical resistance of the semi-transmissive electrode 214A and made of a conductive material having sufficient translucency with respect to the light generated at the light-emitting layer 213C. For example, a chemical compound containing indium (In), zinc (Zn), and oxygen is preferable for the material constituting the transparent electrode 214B. This is because a favorable conductive characteristic can be obtained even when a film is formed at room temperature.

The sealing panel 70B is positioned on a side of the cathode 214 of the drive panel 70A as illustrated in FIG. 3A and has a sealing substrate 73 sealing the organic EL elements 21R, 21G, and 21B in combination with the adhesive layer 71. The sealing substrate 73 is made of a material such as glass. For example, the color filter 74 and a reflected light absorption film 75 functioning as a black matrix are provided in the sealing substrate 73. The color filter 74 and the reflected light absorption film 75 take out light emitting from the organic EL elements 21R, 21G, and 21B, while absorbing light from outside reflected on the organic EL elements 21R, 21G, and 21B and wiring electrodes (the anode 211 and the cathode 214) positioned between the elements. Contrast can be improved by preventing this reflection of light from outside.

The color filter 74 and the reflected light absorption film 75 can be provided on a surface on any side of the sealing panel 70B but preferably, are provided on a surface on aside of the drive panel 70A. This is because the color filter 74 and the reflected light absorption film 75 can be protected by the adhesive layer 71 without appearing on an outer surface. The color filter 74 has filters 74R, 74G, and 74B of colors individually corresponding to the respective colors of the organic EL elements 21R, 21G, and 21B and these filters 74R, 74G, and 74B are arranged in order so as to correspond to the organic EL elements 21R, 21G, and 21B, respectively.

As described above, the organic EL display apparatus 10 serving as a basic concept of the present disclosure is configured in such a manner that the color filter 74 including the filters 74R, 74G, and 74B is arranged for each set of the subpixels individually including the organic EL elements 21R, 21G, and 21B. Additionally, by combining the aforementioned resonator structure with the color filter 74, the reflection of light from outside at the organic EL elements 21R, 21G, and 21B and the wiring electrodes located between the elements can be prevented, while the enhancement of the color purity can be attained. As a result, lower power consumption and a longer service life as well as high resolution can be achieved.

Incidentally, each of the filters 74R, 74G, and 74B of the color filter 74 usually has uniform optical density (transmittance/transmission spectrum) in a spatial direction (an in-plane direction of the filters). The term "uniform" used here implies not only being strictly uniform but also being substantially uniform and any sorts of variations generated by design or in manufacturing are allowed.

Figure 4A:
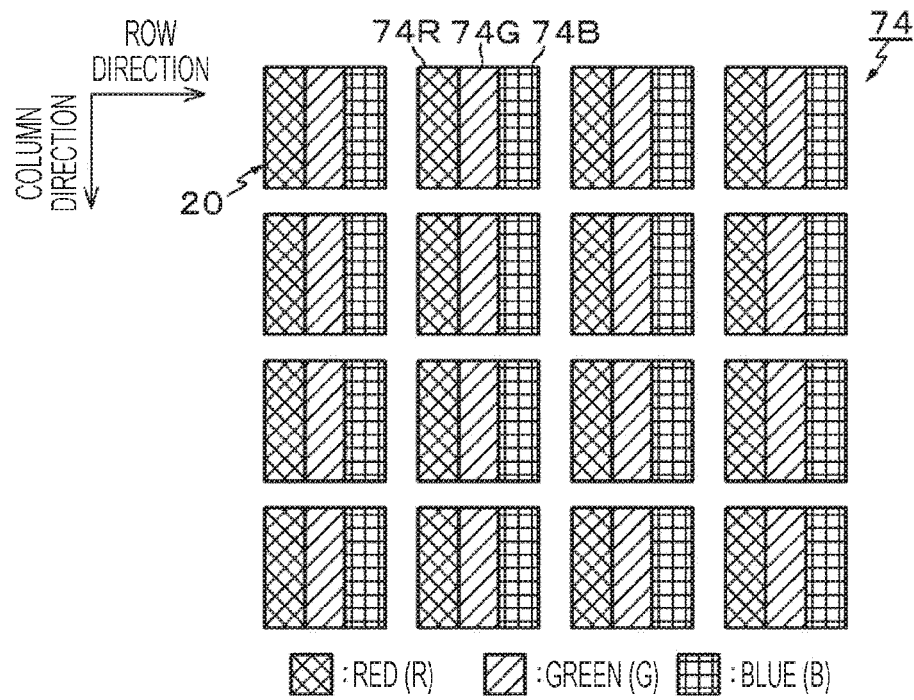
FIG. 4A is a diagram illustrating an example of color coding for a normal color filter in which an optical density is uniform in a spatial direction.

FIG. 4A illustrates an example of color coding for the color filter 74. A case where the stripe array is employed for the color coding for the organic EL elements 21R, 21G, and 21B is used here as an example. Accordingly, the stripe array is also employed for the color coding for the color filter 74 in line with the color coding for the organic EL elements 21R, 21G, and 21B.

In the color filter 74 having the stripe array, the three filters 74R, 74G, and 74B individually disposed for three subpixels adjacent in the row direction (a left-right direction in FIG. 4A) correspond to one pixel (unit pixel) 20 that functions as a unit when a color image is formed. FIG. 4A assumes each set of the three filters 74R, 74G, and 74B corresponding to one pixel 20 as a unit and illustrates certain gaps interposed between the sets in the row direction and the column direction for easier understanding. Actually, however, the gaps are not present in the color coding. This is similarly applicable to FIG. 4B.

When the color filter 74 is arranged at the pixel (subpixel) 20 in the organic EL display apparatus 10, light use efficiency of the organic EL elements 21R, 21G, and 21B is degraded. Additionally, increasing the density of the color filter in order to achieve a wide color gamut degrades brightness. In order to achieve both of the color gamut (color reproduction region) and the brightness having a trade-off relationship as described above, it is simple to cause the organic EL elements 21R, 21G, and 21B to emit light at high brightness. However, emitting light at high brightness increases the power consumption of the organic EL display apparatus 10.

<Embodiment of Present Disclosure>

In such a situation, according to an embodiment of the present disclosure, the subpixels having different light emission spectra of light emission colors are mixed in units of pixels or subpixels in order to achieve both of the high brightness and the wide color gamut having a trade-off relationship without increasing the power consumption. The "light emission spectrum" here stands for a distribution of light intensity relative to a wavelength of light. In the embodiment, in order to mix the subpixels having different light emission spectra of light emission colors, a configuration in which the optical density of the color filter 74 is differentiated from pixel to pixel or from subpixel to subpixel is adopted for the organic EL display apparatus 10 configured in such a manner that the color filter 74 is arranged for each set of the subpixels individually including the organic EL elements 21R, 21G, and 21B. Differentiating the optical density of the color filter 74 is equivalent to differentiating the light transmittance and the transmission spectrum of the color filter 74.

[Color Coding for Color Filter]

Figure 4B:
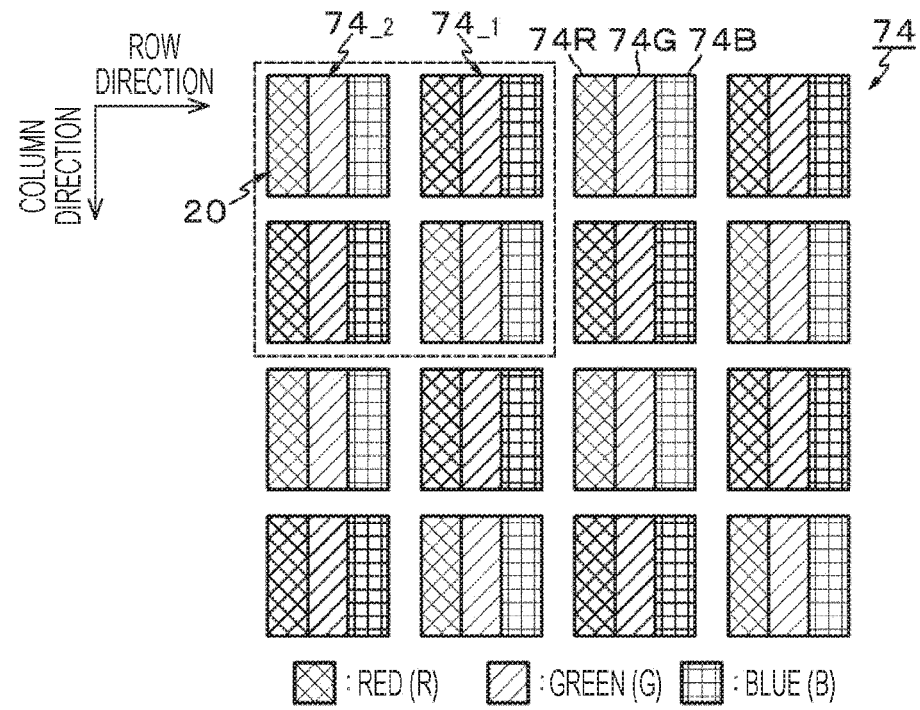
FIG. 4B is a diagram illustrating an example of color coding for a color filter according to an embodiment of the present disclosure.

FIG. 4B is a diagram illustrating an example of the color coding for the color filter according to an embodiment of the present disclosure. In a similar manner to the case of the normal color coding illustrated in FIG. 4A, a case where the three filters 74R, 74G, and 74B adjacent in the row direction correspond to one pixel 20 in the color coding employing the stripe array is used here as an example.

Here, the plurality of pixels 20, for example, four pixels 20 adjacent laterally and longitudinally are regarded as a unit (set/group). Besides, among the four pixels 20 functioning as a unit, every two pixels adjacent diagonally are regarded as a pair such that the optical density of color filters 74$_{-1}$ for two pixels of one pair is relatively increased, while the optical density of color filters 74$_{-2}$ for two pixels of another pair is relatively decreased. The color filters 74$_{-1}$ having the increased optical density and the color filters 74$_{-2}$ having the decreased optical density are mixed in a checker pattern in units of pixels when the color filters 74 are viewed as a whole.

In FIG. 4B, the color filters 74$_{-1}$ having the increased optical density are depicted with thicker lines, whereas the color filters 74$_{-2}$ having the decreased optical density are depicted with thinner lines. The density of the color filters 74$_{-1}$ having the increased optical density is set to, for example, a similar extent to the optical density of the color filter 74 illustrated in FIG. 4A in the case of the normal color coding. The optical density can be adjusted using, for example, a material constituting the color filter 74 or the like.

As described above, the color filters 74$_{-1}$ having the increased optical density and the color filters 74$_{-2}$ having the decreased optical density are mixed, whereby the subpixels R, G, and B having different light emission spectra of light emission colors are mixed in units of pixels as a consequence. Because the subpixels R, G, and B having different light emission spectra of light emission colors are mixed, it is made possible to drive the plurality of subpixels R, G, and B having different light emission colors while drive ratio therebetween is varied.

A fact that the color filter 74$_{-1}$ has the relatively increased optical density here means that the color filter 74$_{-1}$ has relatively low light transmittance. And conversely, a fact that the color filter 74$_{-2}$ has the relatively decreased optical density means that the color filter 74$_{-2}$ has relatively high light transmittance. Accordingly, a state where the subpixels having different light emission spectra of light emission colors are mixed represents that the subpixels having relatively high-intensity light emission spectra of light emission colors (the subpixels having the relatively decreased optical density) and the subpixels having relatively low-intensity light emission spectra of light emission colors (the subpixels having the relatively increased optical density) are mixed.

Note that the color filters 74$_{-2}$ having the relatively decreased optical density are assumed to include a filter having a light transmittance of substantially 100 [%] as well. In addition, a pixel disposed with the filter having a light transmittance of substantially 100 [%] is equivalent to a pixel without the filter (a pixel not disposed with any filter). In a case where the pixel having the color filter 74$_{-2}$ having the relatively decreased optical density is assumed as a pixel on which the filter is not present (without any filter), color coding in which the color filters 74$_{-1}$ having the increased optical density are laid out in the checker pattern is obtained in a case where the color filters 74 are viewed as a whole.

In the following description, color coding in which the color filters 74$_{-1}$ are laid out in the checker pattern will be used as an example of the color coding in which the color filters 74$_{-1}$ having the increased optical density and the color filters 74$_{-2}$ having the decreased optical density are mixed in the checker pattern. Accordingly, in this case, the pixels on which the color filters 74$_{-1}$ are present (the pixels with filters) and the pixels on which the color filters 74$_{-1}$ are not present (the pixels without filters) are mixed in the checker pattern.

Figure 5A:
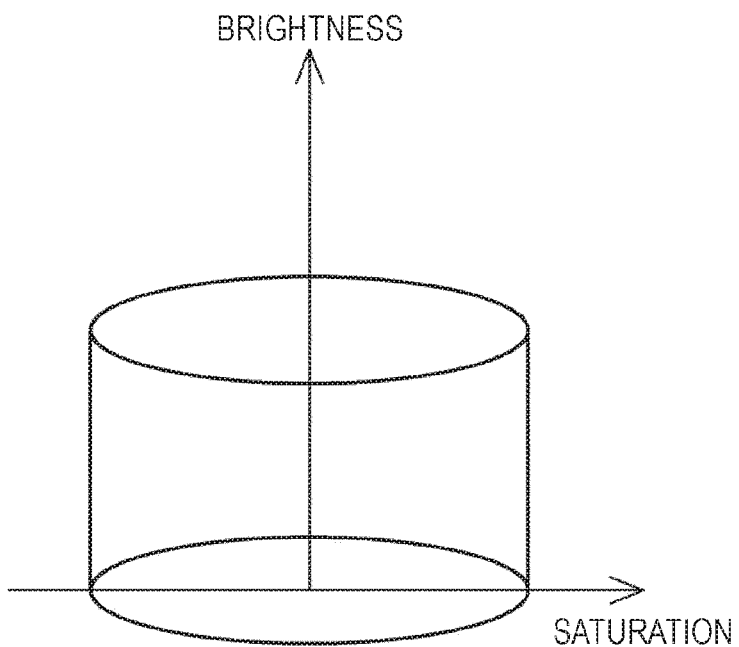
FIG. 5A is a diagram illustrating a color solid in the case of the color coding illustrated in FIG. 4A where the optical density is uniform in the spatial direction.
Figure 5B:
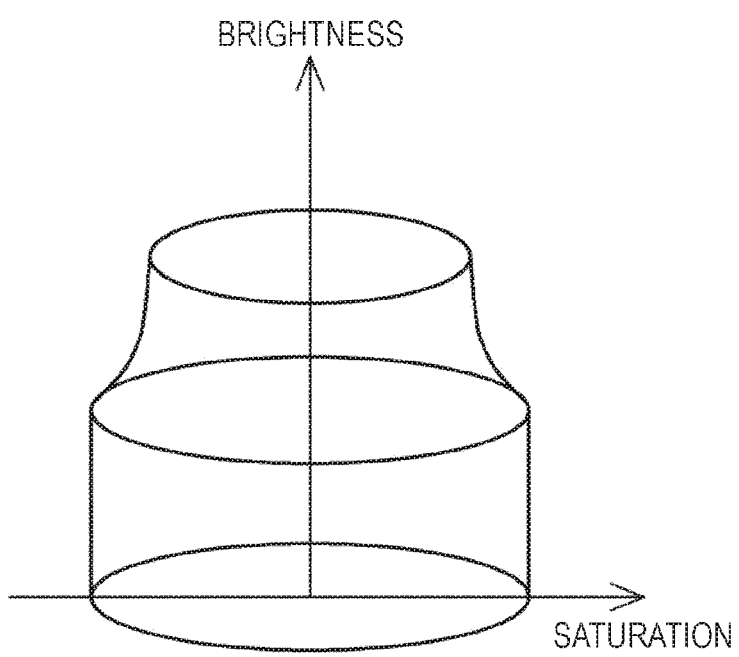
FIG. 5B is a diagram illustrating a color solid in the case of the color coding illustrated in FIG. 4B where the color filters are arranged in a checker pattern.

As a consequence, when the subpixels having relatively high-intensity light emission spectra of light emission colors are mainly driven to emit light in the organic EL display apparatus 10 in which the pixels with filters and the pixels without filters are mixed, the high brightness can be achieved. On the other hand, when the subpixels having relatively low-intensity light emission spectra of light emission colors are mainly driven to emit light, the wide color gamut can be achieved. FIG. 5A illustrates a color solid in the case of the color coding illustrated in FIG. 4A where the optical density is uniform in the spatial direction, whereas FIG. 5B illustrates a color solid in the case of the color coding illustrated in FIG. 4B where the color filters 74$_{-1}$ are laid out in the checker pattern.

In the case of the color coding illustrated in FIG. 4A where the optical density is uniform in the spatial direction, the color gamut is wide but the brightness is low as illustrated in FIG. 5A. In contrast to this, in the case of the color coding illustrated in FIG. 4B where the color filters $74_{-1}$ are arranged in the checker pattern, although spatial resolution is degraded, the color gamut is wide. In addition, as illustrated in FIG. 5B, the brightness is added in proportion with an increase in number of the pixels without filters (the pixels disposed with the color filters $74_{-2}$ having the decreased optical density). As it is clear from this fact, both of the high brightness and the wide color gamut having a trade-off relationship can be achieved by controlling the drive ratio between the subpixels having different light emission spectra of light emission colors.

Additionally, as previously mentioned, by combining the resonator structure with the color filter 74, the reflection of light from outside at the organic EL elements 21R, 21G, and 21B and the wiring electrodes located between the elements can be prevented and the color purity can be enhanced. Consequently, lower power consumption and a longer service life as well as high resolution can be achieved. Here, in a case where the color gamut, the brightness, and the electric power are compared through desktop calculations between a case where the color filters are disposed in all pixels, a case where the color filters are not disposed in any pixels, and a case where the color filters are arranged in the checker pattern, results are as illustrated in FIGS. 6A, 6B and 6C.

FIG. 6A illustrates a case where the color filters are disposed in all pixels, namely, a case with the color filters. FIG. 6B illustrates a case where the color filters are not disposed in any pixels, namely, a case without the color filters. FIG. 6C illustrates a case where the color filters are arranged in the checker pattern, namely, a mixture case with and without the color filters. In FIGS. 6A, 6B, and 6C, pixels $20_{-1}$ disposed with the color filters are depicted with thicker lines, whereas pixels $20_{-2}$ not disposed with the color filters are depicted with thinner lines.

With regard to the color gamut (sRGB coverage), 150 [%] for FIG. 6A, 100 [%] for FIG. 6B, and 150 [%] for FIG. 6C are obtained. With regard to brightness ratios, 100 [%] for FIG. 6A, 150 [%] for FIG. 6B, and 125 [%] for FIG. 6C are obtained under the same conditions on current. With regard to electric power ratios, 100 [%] for FIG. 6A, 67 [%] for FIG. 6B, and 80 [%] for FIG. 6C are obtained under the same conditions on current. In a case where the case in FIG. 6A where the color filters are disposed in all pixels and the case in FIG. 6B where the color filters are not disposed in any pixels are compared, the former case is superior from the standpoints of the color gamut and the electric power, while the latter case is superior from the standpoint of the brightness. In contrast to this, the case in FIG. 6C where the color filters are laid out in the checker pattern is slightly inferior to the former case from the standpoint of the electric power but superior to the aforementioned two cases from both the standpoints of the color gamut and the brightness. It is apparent from the fact described thus far that, both of the high brightness and the wide color gamut having a trade-off relationship can be achieved by mixing the subpixels having relatively high-intensity light emission spectra of light emission colors and the subpixels having relatively low-intensity light emission spectra of light emission colors and controlling the drive ratio between the subpixels having different light emission spectra of light emission colors.

Note that, although the above example has used the uniform density of the color filters among the subpixels with the color filters, a configuration using the optical density of the color filters differentiated from pixel to pixel or from subpixel to subpixel also can be adopted.

[Signal Processing Algorithm]

Figure 7:
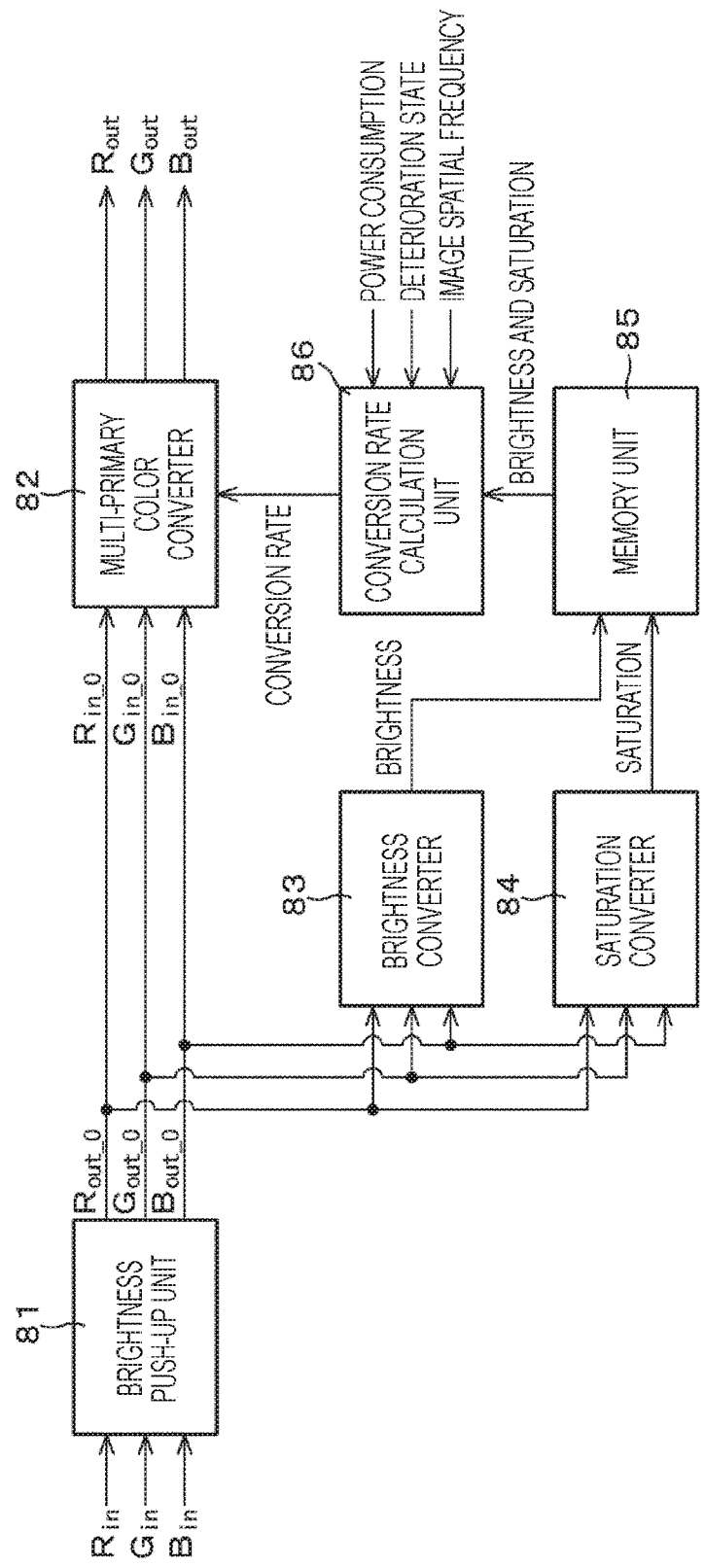
FIG. 7 is a block diagram illustrating an exemplary configuration of a signal processing circuit for a video signal to drive a multi-primary color display panel.

Specific action of a signal processing algorithm will be described hereinafter with reference to FIG. 7. FIG. 7 is a block diagram illustrating an exemplary configuration of the signal processing circuit for the video signal to drive a multi-primary color display panel.

As illustrated in FIG. 4B, the organic EL display apparatus 10 according to the embodiment adopts a configuration in which the color filters $74_{-1}$ are arranged in, for example, the checker pattern such that primary colors are dispersed in the spatial direction. In this case, in order to appropriately render colors as colors corresponding to the video signals, information on neighboring pixels is required in a case where the signal processing is carried out on one particular pixel. For this reason, a unit of the dispersion of the primary colors, specifically, four pixels adjacent laterally and longitudinally (2×2 pixels) exemplified in FIG. 4B are regarded as a unit while the signal processing is carried out. However, the unit for carrying out the signal processing is not limited to the four pixels consisting of 2×2 pixels.

As illustrated in FIG. 7, the signal processing circuit 80 according to the embodiment includes a brightness push-up unit 81, a multi-primary color converter 82, a brightness converter 83, a saturation converter 84, a memory unit 85, and a conversion rate calculation unit 86. The signal processing circuit 80 receives input of RGB video signals and carries out the signal processing by assuming four pixels 20 enclosed by a dashed line in FIG. 4B as one signal processing unit.

In the signal processing circuit 80, the brightness push-up unit 81 carries out processing to multiply RGB input video signals $R_{in}$, $G_{in}$, and $B_{in}$ by a push-up gain. Specifically, by assuming that the push-up gain is G and the video signals output from the brightness push-up unit 81 are $R_{out\_0}$, $G_{out\_0}$, and $B_{out\_0}$, the brightness push-up unit 81 carries out the following computational processing:

$$R_{out\_0} = R_{in} \times G$$

$$G_{out\_0} = G_{in} \times G$$

$$B_{out\_0} = B_{in} \times G$$

That is, the brightness push-up unit 81 carries out processing for pushing up (emphasizing) the brightness by multiplying the input video signals $R_{in}$, $G_{in}$, and $B_{in}$ by the push-up gain G.

The push-up gain G can be found depending on the input video signals $R_{in}$, $G_{in}$, and $B_{in}$. For example, gradation values of the input video signals $R_{in}$, $G_{in}$, and $B_{in}$ are converted to the brightness or the luminosity and then, a lookup table (LUT) holding the push-up gain G corresponding to the brightness or the luminosity is referenced, whereby the push-up gain G can be found. Although the push-up gain G is here assumed to be found depending on the input video signals $R_{in}$, $G_{in}$, and $B_{in}$, a fixed value not depending on the input video signals $R_{in}$, $G_{in}$, and $B_{in}$ can be employed as well.

The video signals $R_{out\_0}$, $G_{out\_0}$, and $B_{out\_0}$ output from the brightness push-up unit 81 are input to the multi-primary color converter 82 and at the same time, branched to be input to the brightness converter 83 and the saturation converter 84. The brightness converter 83 converts values of the RGB video signals $R_{out\_0}$, $G_{out\_0}$, and $B_{out\_0}$ to the brightness or the luminosity pixel by pixel. The saturation converter 84 converts values of the RGB video signals $R_{out\_0}$, $G_{out\_0}$, and $B_{out\_0}$ to the saturation pixel by pixel. Generally known technologies can be used for the conversion processing by the brightness converter 83 and the saturation converter 84.

Information on the brightness or the luminosity of each of the pixels obtained at the brightness converter 83 and information on the saturation of each of the pixels obtained at the saturation converter 84 are input to the memory unit 85. Information on neighboring pixels is required when the signal processing is carried out on one particular pixel and thus, the memory unit 85 is provided to store this information on neighboring pixels. With this, in a case where 2×2 pixels are considered as one signal processing unit, it is made possible for the conversion rate calculation unit 86 at a latter stage to reference information on these four pixels.

The conversion rate calculation unit 86 references the information on the plurality of pixels stored in the memory unit 85, specifically, the brightness or the luminosity and the saturation of four pixels if 2×2 pixels are considered as one signal processing unit. Subsequently, the conversion rate calculation unit 86 calculates a "conversion rate" on the basis of the brightness or the luminosity and the saturation of the four pixels to determine to what extent each of an RGB pixel with increased density and an RGB pixel with decreased density is caused to emit light. The RGB pixel with increased density here represents a pixel disposed with the color filter (CF) 74$_{-1}$ (pixel with CF), whereas the RGB pixel with decreased density represents a pixel not disposed with the color filter (pixel without CF). In addition, the conversion rate is a drive ratio between the RGB pixel with increased density and the RGB pixel with decreased density.

The conversion rate takes a value in a range from 0 to 1.0 when the decimal places are included. In a case where the conversion rate is zero, an action is taken such that the light emission brightness of the RGB pixel with decreased density is set to zero and the light emission brightness of the RGB pixel with increased density is raised as much as possible. On the other hand, in a case where the conversion rate is 1.0, an action is taken such that the light emission brightness of the RGB pixel with increased density is set to zero and the light emission brightness of the RGB pixel with decreased density is raised as much as possible. In addition, in a case where the conversion rate is a median between 0 and 1.0, an action is taken such that both of the RGB pixel with increased density and the RGB pixel with decreased density emit light.

Figure 8:
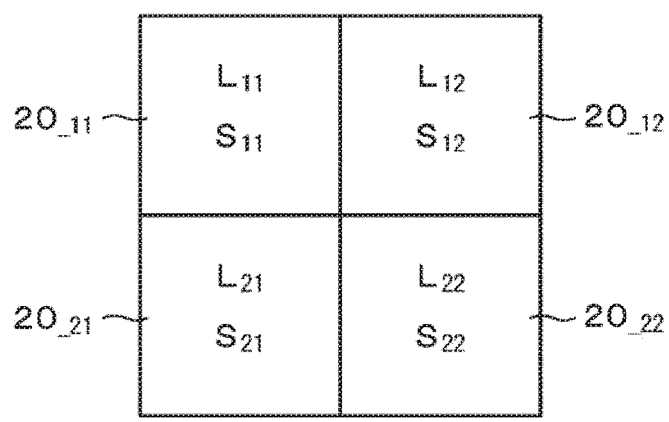
FIG. 8 is a diagram illustrating relations between the brightness or luminosity and saturation at respective pixels in a pixel group consisting of 2×2 pixels.

The conversion rate can be found in the following manner. That is, among a pixel group consisting of 2×2 pixels illustrated in FIG. 8, the brightness or the luminosity of an upper left pixel 20_11 is assumed as L11 and the saturation thereof is assumed as S11.

The brightness or the luminosity of an upper right pixel 20_12 is assumed as L12 and the saturation thereof is assumed as S12.

The brightness or the luminosity of a lower left pixel 20_21 is assumed as L21 and the saturation thereof is assumed as S21.

The brightness or the luminosity of a lower right pixel 20_22 is assumed as L22 and the saturation thereof is assumed as S22.

Here, when average brightness or average luminosity of the 2×2 pixels is assumed as $L_{ave}$ and average saturation thereof is assumed as $S_{ave}$, the average brightness or the average luminosity $L_{ave}$ and the average saturation $S_{ave}$ are given by the following formulas.

$$L_{ave}=(L_{11}+L_{12}+L_{21}+L_{22})/4$$

$$S_{ave}=(S_{11}+S_{12}+S_{21}+S_{22})/4$$

The conversion rate calculation unit 86 has a lookup table (LUT) holding, for example, the conversion rate corresponding to the average brightness or the average luminosity $L_{ave}$ and the average saturation $S_{ave}$, thereby finding out the conversion rate depending on the average brightness or the average luminosity $L_{ave}$ and the average saturation $S_{ave}$ that have been calculated. Although the conversion rate is here assumed to be found using the lookup table, the conversion rate can be found through computational processing based on the average brightness or the average luminosity $L_{ave}$ and the average saturation $S_{ave}$.

Figure 9:
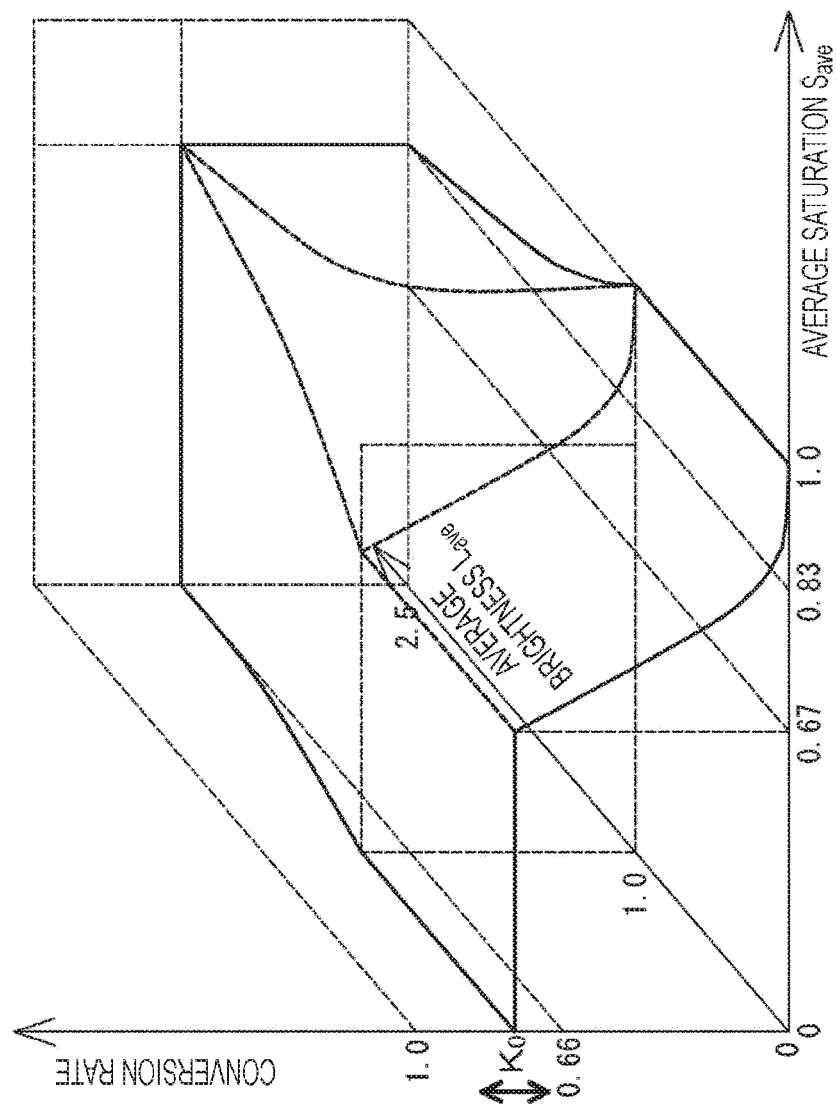
FIG. 9 is an explanatory diagram for a specific example of finding a conversion rate in a lookup table.

A specific example of finding out the conversion rate in the lookup table will be described with reference to FIG. 9. In FIG. 9, the average saturation $S_{ave}$=1.0 is a value normalized using maximum density of the RGB pixel with increased density. According to the example in FIG. 9, the average saturation $S_{ave}$ of the RGB pixel with decreased density is 0.83, whereas the average saturation $S_{ave}$ when the RGB pixel with increased density and the RGB pixel with decreased density simultaneously emit light is 0.67. Meanwhile, the average brightness (average luminosity) $L_{ave}$=1.0 is a value normalized using maximum brightness of the RGB pixel with increased density. The average brightness $L_{ave}$ obtained by collecting together the RGB pixel with decreased density and the RGB pixel with increased density is 2.5 in the example in FIG. 9.

According to settings of the conversion rate in this lookup table, an area other than an area where the average saturation $S_{ave}$ or the average brightness $L_{ave}$ is maximized serves as an area allowing a degree of freedom in allocations to the RGB pixel with decreased density and the RGB pixel with increased density (namely, the conversion rate). The specific example illustrated in FIG. 9 represents an example where a single conversion rate $K_0$ is applied in an area where $S_{ave}$=0.0 to 0.67 and $L_{ave}$=0.0 to 1.0 are obtained and, in linkage with this, surrounding conversion rates are set so as to be smoothly connected thereto. The value of the conversion rate $K_0$ can be freely determined within a range from 0.0 to 1.0. Accordingly, as described later, an optimum value of the conversion rate can be selected from the lookup table from the viewpoints of resolution, power consumption, and a service life.

The conversion rate calculation unit 86 also can adopt a configuration to control the conversion rate by applying modes. Specifically, the conversion rate is raised from the viewpoint of the power consumption of the organic EL display apparatus 10. The conversion rate is lowered from the viewpoint of the service life (deterioration state of the organic EL element 21). Alternatively, the conversion rate is lowered from the viewpoint of the resolution (image spatial frequency). A variety of control modes can be employed through the application of a mode in this manner such that, for example, the light emission state is implemented by choosing which mode is given a priority.

In addition to the aforementioned control of the conversion rate through the application of a mode, the conversion rate calculation unit 86 also can adopt a configuration to control the lookup table on the basis of information such as the power consumption of the organic EL display apparatus 10, the deterioration state of the organic EL element 21, and the image spatial frequency such that a desired conversion rate can be obtained in real time. The information on the power consumption can be detected from the standpoint of hardware, or alternatively, can be detected depending on an integrated value of the video signals. The information on the deterioration state can be detected depending on a lighting time of the organic EL element 21, or alternatively, can be detected from a history of the video signals that have been displayed. The information on the image spatial frequency can be detected by mathematically analyzing a frequency.

The multi-primary color converter 82 converts the input video signal of the pixel currently handled to an output video signal on the basis of the conversion rate found at the conversion rate calculation unit 86. Here, the input video signals of the multi-primary color converter 82 are assumed as $R_{in\_0}$, $G_{in\_0}$, and $B_{in\_0}$ (=$R_{out\_0}$, $G_{out\_0}$, $B_{out\_0}$) and the output video signals thereof are assumed as $R_{out}$, $G_{out}$, and $B_{out}$. In addition, the conversion rate (drive ratio) is assumed as K, while a horizontal coordinate of the pixel currently handled is assumed as x and a vertical coordinate thereof is assumed as y. Whether the pixel currently handled is the RGB pixel with increased density or the RGB pixel with decreased density is judged depending on values of the horizontal coordinate x and the vertical coordinate y.

Conversion formulas are indicated below separately for two cases, namely, for the RGB pixel with increased density (relatively weak light emission spectrum/low intensity) and for the RGB pixel with decreased density (relatively strong light emission spectrum/high intensity).

(1) For RGB Pixel with Increased Density

In the case of the RGB pixel with increased density, the input video signals $R_{in\_0}$, $G_{in\_0}$, and $B_{in\_0}$ are multiplied by (1.0−K) as indicated by the following formulas, whereby the conversion to the output video signals $R_{out}$, $G_{out}$, and $B_{out}$ can be carried out.

$R_{out}=(1.0-K) \times R_{in\_0}$ $G_{out}=(1.0-K) \times G_{in\_0}$ $B_{out}=(1.0-K) \times B_{in\_0}$ (2) For RGB Pixel with Decreased Density Maximum brightness of the RGB pixel with decreased density (the subpixel having relatively strong light emission spectra) is assumed as $L_a$ and maximum brightness of the RGB pixel with increased density (the subpixel having relatively weak light emission spectra) is assumed as $L_b$. The brightness or the luminosity $L_{11}$, $L_{12}$, $L_{21}$, and $L_{22}$ of the respective pixels in the pixel group consisting of 2×2 pixels are uniquely defined by display design and thus, $L_b/L_a$ can be calculated in advance to be set to a register or the like.

When the RGB pixel with decreased density and the RGB pixel with increased density are driven by the video signals at the same level, the maximum brightness differs between the RGB pixel with decreased density and the RGB pixel with increased density. For example, in a case where the RGB pixel with decreased density can obtain two times a brightness of 1 of the RGB pixel with increased density, $L_b/L_a$ is obtained as ½=0.5.

In the case of the RGB pixel with decreased density, the input video signals $R_{in\_0}$, $G_{in\_0}$, and $B_{in\_0}$ are multiplied by the conversion rate K and $L_b/L_a$ as indicated by the following formulas, whereby the conversion to the output video signals $R_{out}$, $G_{out}$, and $B_{out}$ can be carried out.

$R_{out}=(K \times L_b/L_a) \times R_{in\_0}$ $G_{out}=(K \times L_b/L_a) \times G_{in\_0}$ $B_{out}=(K \times L_b/L_a) \times B_{in\_0}$

[Actions and Effects of Embodiment]

When driven by the video signals to which the above signal processing has been applied, the multi-primary color display panel can achieve a display at higher brightness than that of a display apparatus including the RGB pixel with increased density only and also can achieve a display with a wider color gamut than that of a display apparatus including the RGB pixel with decreased density only. Additionally, both of the high brightness and the wide color gamut having a trade-off relationship can be achieved by controlling the drive ratio between the RGB pixel with increased density and the RGB pixel with decreased density, even while the light-emitting unit does not emit light at high brightness.

FIG. 10 is a conceptual diagram of the extension of the saturation and the brightness. The conceptual diagram in FIG. 10 is a diagram illustrating a constant hue plane when the color solid illustrated in FIG. 5B is taken across a vertical plane including a central axis (achromatic color axis).

In FIG. 10 illustrating a color space obtained through mapping by the saturation and the luminosity, a maximum reproduction range of the display panel according to the embodiment, namely, the display panel in which the pixels with and without the color filters (CFs) are mixed is indicated by a solid line $L_1$. In addition, a maximum reproduction range while the pixel with the color filter does not light up and the pixel without the color filter lights up is indicated by a one-dot chain line $L_2$, whereas a maximum reproduction range while the pixel with the color filter lights up and the pixel without the color filter does not light up is indicated by a dashed line $L_3$.

On the solid line $L_1$ indicating the maximum reproduction range of the display panel according to the embodiment, a point with a luminosity of 0% and a saturation of 100% (e.g., cyan) is assumed as a point A, a point with a luminosity of 100% and a saturation of 100% is assumed as a point B, and a point with a luminosity of 250% and a saturation of 83% is assumed as a point C. In addition, a point with a luminosity of 0% and a saturation of 100% (e.g., red) is assumed as a point D, a point with a luminosity of 100% and a saturation of 100% is assumed as a point E, and a point with a luminosity of 250% and a saturation of 83% is assumed as a point F.

Figure 11A:
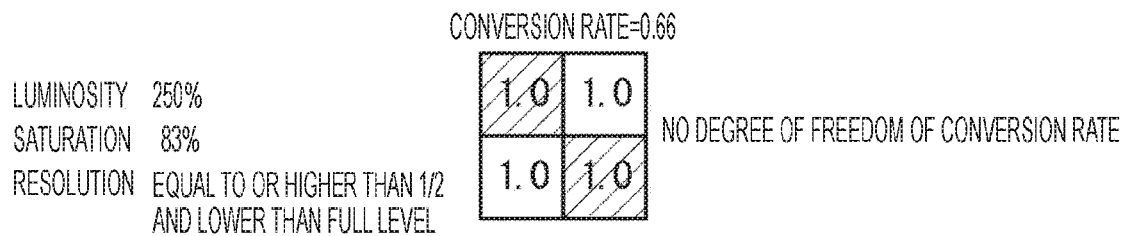
FIGS. 11A, 11B and 11C are diagrams schematically illustrating light emission states of the respective pixels in a display panel according to an embodiment.
Figure 11B:
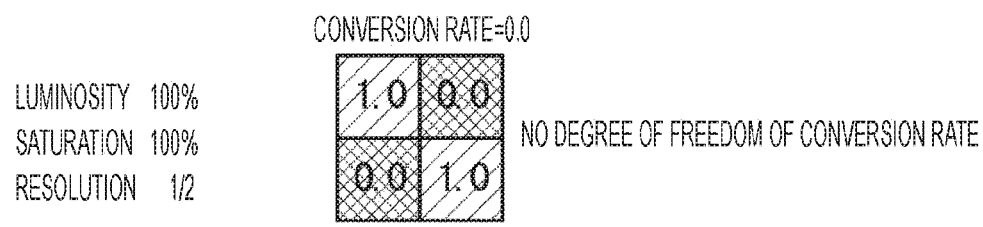
Figure 11C:
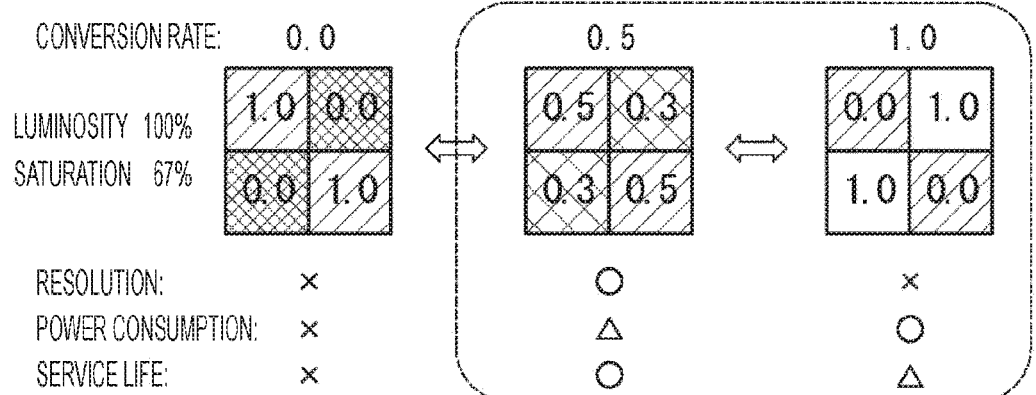

FIGS. 11A, 11B, and 11C schematically illustrate the light emission states of the respective pixels at the points C and B on the solid line $L_1$ and the light emission states of the respective pixels at a point G located in an inner area of the line (driving images of the respective pixels).

In FIGS. 11A, 11B, and 11C, a maximum signal level is expressed by 1.0, a minimum signal level is expressed by 0.0, and signal levels between the maximum signal level and the minimum signal level are expressed by 0.3 and 0.5. In addition, as also illustrated in FIG. 10, pixels depicted with hatching represent the pixels with the color filters (CFs), whereas pixels not depicted with hatching (pixels depicted by outlines and pixels depicted with shading) represent the pixels without CFs.

At the point C expressing the maximum brightness (white), all of the 2×2 pixels are driven at the maximum signal level (1.0), that is, all of the pixels are caused to light up, as illustrated in FIG. 11A. Meanwhile, at the point B expressing the maximum saturation, the pixels with CFs are driven at the maximum signal level (1.0), that is, caused to light up, while the pixels without CFs are driven at the minimum signal level (0.0), that is, not caused to light up, as illustrated in FIG. 11B. As in the case of the respective pixels at these points C and B on the solid line $L_1$, no degree of freedom of the conversion rate K is allowed for colors on the line of the maximum reproduction range of the display panel.

On the other hand, a degree of freedom for choosing what percentage (drive ratio) is used when the pixels with CFs and the pixels without the CFs are driven, namely, a degree of freedom of the conversion rate K is allowed in an area at the inside of the solid line $L_1$. In particular, in an area including the point G illustrated in FIG. 10 with shading (an area with a saturation of 67% or less and a luminosity of 100% or less), the conversion rate K can be freely set between 0.0 and 1.0. In FIG. 11C, circular marks represent superior levels, triangular marks represent somewhat superior levels, and cross marks represent inferior levels from the viewpoints of the resolution, the power consumption, and the service life.

The conversion rate K=0.0 illustrated on a leftmost side of FIG. 11C is at the inferior levels with respect to all the viewpoints of the resolution, the power consumption, and the service life. In the case of the conversion rate K=1.0 illustrated on a rightmost side, only the pixels without CFs are caused to light up, whereby the power consumption decreases. Accordingly, highest efficiency, namely, the superior level is achieved with respect to the viewpoint of the power consumption. However, thinned-out lighting is carried out in this case and thus, the resolution is sacrificed.

In a case where the sacrifice of the resolution is desired to be avoided, what percentage is used in a case where the pixels without CFs are caused to light up is selected, as in the case of the conversion rate K=0.5 illustrated at the center. With this, the 2×2 pixels are entirely caused to light up, whereby the resolution is raised. Accordingly, the superior level is achieved with respect to the viewpoint of the resolution. As another aspect of this case, however, the inferior level is observed compared to the case of the conversion rate K=1.0 with respect to the viewpoint of the power consumption. The organic EL element has a characteristic of faster deterioration in a case where a higher signal level is used in driving. Therefore, with respect to the viewpoint of the service life of a device, the most superior level is achieved in the case of the conversion rate K=0.5 illustrated at the center, where the 2×2 pixels are entirely driven at a lower signal level.

The optimum value of the conversion rate K is settled in this manner by choosing which of the resolution, the power consumption, and the service life is given a priority, that is, from the viewpoints of the resolution, the power consumption, and the service life. Consequently, optimizing design can be implemented for the display panel individually in consideration of usage and the input video signal. As a result, driving to achieve both of the high brightness and the wide color gamut having a trade-off relationship can be realized while an increase in the power consumption is avoided.

<Variations>

The technology according to the present disclosure has been described thus far on the basis of the preferable embodiments. However, the technology according to the present disclosure is not limited to the above-described embodiments. The configurations and structures of the display apparatus described above in the embodiments merely serve as examples and can be modified as appropriate. For example, the subpixels having different light emission spectra of light emission colors have been mixed in units of pixels in the above-described embodiments but a configuration for mixture in units of subpixels also can be adopted.

Meanwhile, in the above-described embodiments, the light emission spectra of light emission colors are differentiated by varying the optical density (transmittance/transmission spectra) of the color filters (including the case without the color filter). However, this merely represents an example. As another example, a configuration to differentiate the light emission spectra of light emitting from the organic layer including the light-emitting layer is considered. Specifically, for example, different materials of the light-emitting layer are used in units of pixels or subpixels to differentiate the light emission spectra of light emission colors. Alternatively, the thicknesses of the organic layers including the light-emitting layers are differentiated between the subpixels having the same light emission colors in units of pixels or subpixels. With this, a light emission color having a different light emission spectrum can be obtained through the multiple-beam interference between two electrodes sandwiching the organic layer (the anode 211 and the semi-transmissive electrode 214A in FIG. 3B). Or alternatively, in the case of the organic EL display apparatus including a polarizing plate on a panel surface for the purpose of preventing the reflection of light from outside, the light emission colors having different light emission spectra also can be obtained by different materials of the polarizing plate used in units of pixels or subpixels.

In addition, the above-described embodiments have exemplified the organic EL display apparatus as the display apparatus according to the present disclosure. However, the technology according to the present invention is not limited to the application to the organic EL display apparatus and can be generally applied to plane type (flat panel type) display apparatuses including a liquid crystal display apparatus or the like.

<Electronic Appliance>

The above-described display apparatus according to the present disclosure can be used as a display unit (display apparatus) of an electronic appliance in any sort of field configured to display the video signal input to the electronic appliance or the video signal generated within the electronic appliance as an image or a video. To give an example, the display apparatus can be used as a display unit of a television set, a digital still camera, a note type personal computer, a portable terminal apparatus such as a portable telephone, a video camera, a smartphone, a head-mounted display (a display for wearing on a head), and so on.

When the display apparatus according to the present disclosure is used in the electronic appliance in any sort of field as the display unit thereof in this manner, the following effects can be obtained. That is, according to the technology of the present disclosure, driving to achieve both of the high brightness and the wide color gamut having a trade-off relationship can be realized even while the light-emitting unit does not emit light at high brightness. Consequently, both of the high brightness and the wide color gamut can be achieved while an increase in the power consumption of the electronic appliance is avoided.

The display apparatus according to the present disclosure also includes a display apparatus in a module form having a sealed configuration. To give an example, a display module formed by affixing an opposing unit such as a transparent glass to a pixel array section falls within this case. Additionally, a circuit unit, a flexible print circuit (FPC) or the like may be provided in the display module to input a signal to the pixel array section from outside and output a signal to outside from the pixel array section, for example. A smartphone and a head-mounted display will be exemplified below as specific examples of the electronic appliance using the display apparatus according to the present disclosure. Note that the specific examples indicated here are merely examples and the electronic appliance is not limited thereto.

First Specific Example

Figure 12A:
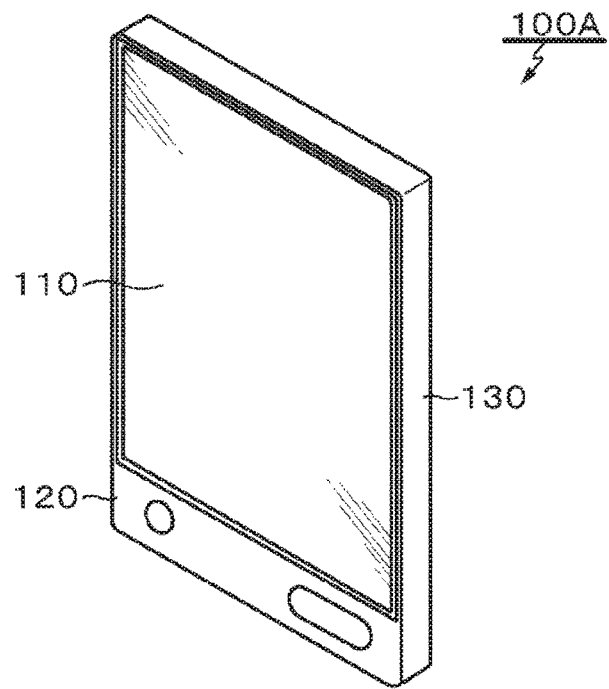
FIGS. 12A and 12B are external views illustrating smartphones according to a first specific example of an electronic appliance of the present disclosure.
Figure 12B:
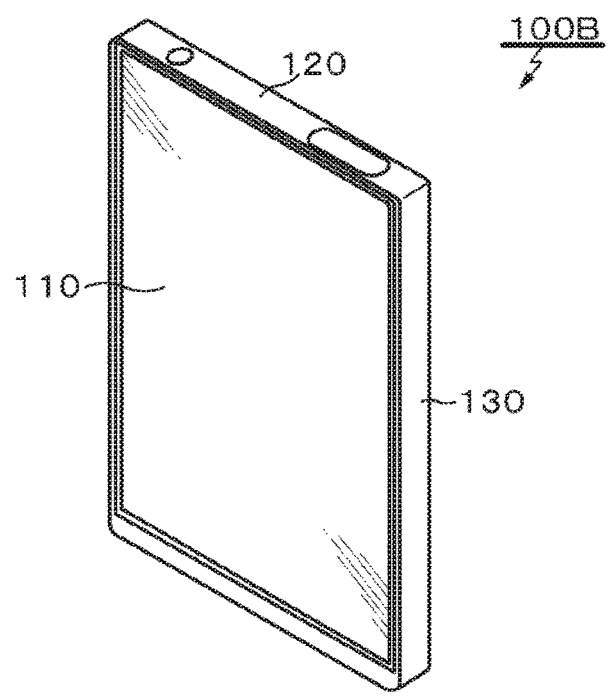

FIGS. 12A and 12B are external views illustrating smartphones according to a first specific example of the electronic appliance of the present disclosure: FIG. 12A illustrates a first example, and FIG. 12B illustrates a second example. Each of the smartphone 100A according to the first example and the smartphone 100B according to the second example includes a display unit 110 and an operation unit 120. In the case of the smartphone 100A according to the first example, the operation unit 120 is provided at a lower portion of the display unit 110 in a cabinet 130. In the case of the smartphone 100B according to the second example, the operation unit 120 is provided on a top surface portion of a cabinet 130. In these configurations, the display apparatus according to the present disclosure can be used as the display units 110 of the smartphones 100A and 100B. That is, the smartphones 100A and 100B according to the first specific example are fabricated using the display apparatus according to the present disclosure as the display units 110 thereof.

Second Specific Example

Figure 13:
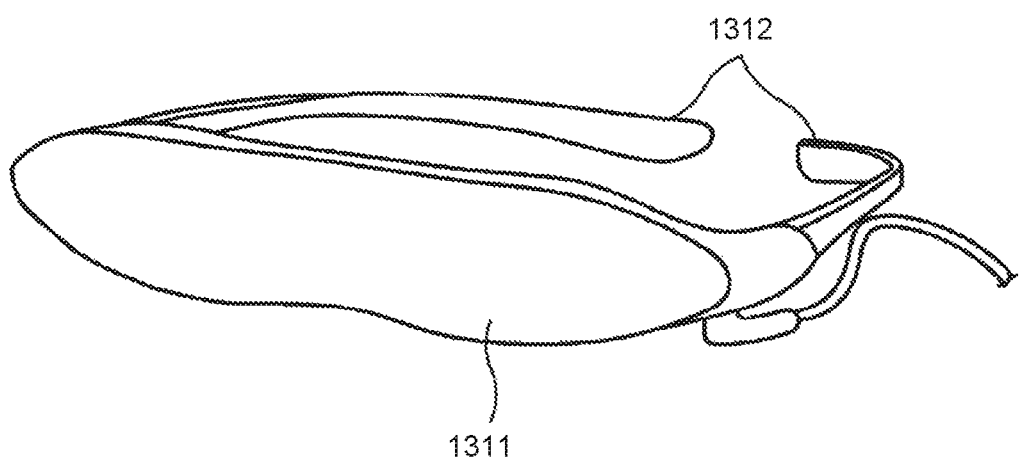
FIG. 13 is an external view illustrating a head-mounted display according to a second specific example of the electronic appliance of the present disclosure.

FIG. 13 is an external view illustrating a head-mounted display according to a second specific example of the electronic appliance of the present disclosure. The head-mounted display has, for example, ear hook portions 1312 for wearing on a head of a user provided on both sides of a display unit 1311 having a glasses shape. In this head-mounted display, the display apparatus according to the present disclosure can be used as the display unit 1311 thereof. That is, the head-mounted display according to the second specific example is fabricated using the display apparatus according to the present disclosure as the display unit 1311 thereof.

Note that the present disclosure can be also configured as described below.

[1] A display apparatus, in which
unit pixels each constituted by a plurality of subpixels having different light emission colors are arranged in a matrix form, and
the subpixels having different light emission spectra of light emission colors are mixed in units of pixels or subpixels.

[2] The display apparatus according to the aforementioned [1], in which
the plurality of subpixels includes color filters, and
optical density of the color filters differs from pixel to pixel or from subpixel to subpixel.

[3] The display apparatus according to the aforementioned [1], in which
the plurality of subpixels includes light-emitting units constituted by organic electro-luminescence elements.

[4] The display apparatus according to the aforementioned [3], in which
the plurality of subpixels includes color filters, and
optical density of the color filters differs from pixel to pixel or from subpixel to subpixel.

[5] The display apparatus according to the aforementioned [3], in which
the subpixels with color filters and the subpixels without color filters are mixed in units of pixels or subpixels.

[6] The display apparatus according to the aforementioned [1], in which
the plurality of subpixels includes light-emitting units constituted by organic electro-luminescence elements, and
light emission spectra of light emitting from light-emitting layers of the organic electro-luminescence elements differ from pixel to pixel or from subpixel to subpixel.

[7] The display apparatus according to the aforementioned [6], in which
in the plurality of subpixels, a thickness of an organic layer including the light-emitting layer differs between the subpixels having the same light emission color in units of pixels or subpixels, and
a light emission color having a different light emission spectrum is obtained through multiple-beam interference between two electrodes sandwiching the organic layer.

[8] The display apparatus according to any one of the aforementioned [1] to [7], including a signal processing circuit that carries out signal processing on video signals driving the plurality of subpixels having different light emission colors by regarding the plurality of unit pixels each including the subpixels having different light emission spectra of light emission colors as one signal processing unit, in which
the signal processing circuit controls a drive ratio between the subpixels having different light emission spectra of light emission colors.

[9] The display apparatus according to the aforementioned [8], in which
the signal processing circuit calculates the drive ratio on the basis of information on brightness or luminosity and information on saturation of the respective unit pixels obtained from the video signals driving the plurality of subpixels having different light emission colors.

[10] The display apparatus according to the aforementioned [9], in which
the signal processing circuit calculates the drive ratio on the basis of average brightness or average luminosity and average saturation of the plurality of unit pixels.

[11] The display apparatus according to any one of the aforementioned [8] to [10], in which
in a case where the drive ratio is assumed as K, maximum brightness of a subpixel having a relatively strong light emission spectrum is assumed as $L_a$, and maximum brightness of a subpixel having a relatively weak light emission spectrum is assumed as $L_b$,
the signal processing circuit carries out the signal processing by multiplying the video signal driving the subpixel by (1.0−K) in the case of the subpixel having a relatively weak light emission spectrum and carries out the signal processing by multiplying the video signal driving the subpixel by $(K \times L_b/L_a)$ in the case of the subpixel having a relatively strong light emission spectrum.

[12] An electronic appliance including a display apparatus, in which display apparatus,
unit pixels each constituted by a plurality of subpixels having different light emission colors are arranged in a matrix form, and
the subpixels having different light emission spectra of light emission colors are mixed in units of pixels or subpixels.

REFERENCE SIGNS LIST

10 Organic EL display apparatus
20 Unit pixel (Pixel/Pixel circuit)
21 (21R, 21G, 21B) Organic EL element
22 Drive transistor
23 Write transistor
24 Storage capacitor
25 Auxiliary capacitor
30 Pixel array section
31 ($31_1$ to $31_m$) Scan line
32 ($32_1$ to $32_m$) Power supply line
33 ($33_1$ to $33_n$) Signal line
34 Common power line 40 Write scanning unit
50 Power supply scanning unit
60 Signal output unit
70 Display panel
74 (74R, 74G, 74B) Color filter
$74_{-1}$ Color filter having relatively increased optical density
$74_{-2}$ Color filter having relatively decreased optical density
80 Signal processing circuit
81 Brightness push-up unit
82 Multi-primary color converter
83 Brightness converter
84 Saturation converter
85 Memory unit
86 Conversion rate calculation unit

The invention claimed is:

1. A display apparatus, comprising:
a plurality of pixels, wherein each pixel of the plurality of pixels comprises a plurality of units of subpixels, wherein
each unit of subpixel of the plurality of units of subpixels comprises a plurality of subpixels in a matrix form,
the plurality of subpixels have different light emission spectra of a plurality of light emission colors, and
the plurality of subpixels are mixed in the plurality of units of subpixels of the plurality of subpixels;
a plurality of color filters associated with the plurality of units of subpixels, wherein
each color filter of the plurality of color filters associated with each unit of subpixel of the plurality of units of subpixels has same optical density,
an optical density of a first set of color filters of the plurality of color filters is greater than an optical density of a second set of color filters of the plurality of color filters,
the first set of color filters are associated with a first unit of subpixel of the plurality of units of subpixels and the second set of color filters are associated with a second unit of subpixel of the plurality of units of subpixels,
a first color filter of the first set of color filters is diagonally adjacent to a second color filter of the first set of color filters, and
a third color filter of the second set of color filters is diagonally adjacent to a fourth color filter of the second set of color filters; and
a signal processing circuit configured to execute signal processing on a plurality of video signals that drives the plurality of subpixels; and
convert the plurality of video signals to a plurality of output video signals based on a conversion rate, wherein
the conversion rate is a drive ratio between a first set of subpixels of the plurality of subpixels and a second set of subpixels, and
the first set of subpixels are associated with the first set of color filters and the second set of subpixels are associated with the second set of color filters.

2. The display apparatus according to claim 1, wherein each subpixel of the plurality of subpixels includes a corresponding light-emitting unit of a plurality of light-emitting units, and
the plurality of light-emitting units comprises organic electro-luminescence elements.

3. The display apparatus according to claim 2, wherein a first plurality of subpixels of the plurality of subpixels with the plurality of color filters and a second plurality of subpixels of the plurality of subpixels without the plurality of color filters are mixed in the plurality of units of subpixels.

4. The display apparatus according to claim 1, wherein each subpixel of the plurality of subpixels includes a corresponding light-emitting unit of a plurality of light-emitting units,
the plurality of light-emitting units comprises organic electro-luminescence elements, and
the light emission spectra of light emitting from a plurality of light-emitting layers of the organic electro-luminescence elements differ from one of pixel to pixel of the plurality of pixels or subpixel to subpixel of the plurality of subpixels.

5. The display apparatus according to claim 4, wherein
in the plurality of subpixels, a thickness of an organic layer that includes the plurality of light-emitting layers differs between the plurality of subpixels having same light emission color in the plurality of units of subpixels, and
a light emission color of the plurality of light emission colors that has a different light emission spectrum is obtained through multiple-beam interference between two electrodes that sandwiches the organic layer.

6. The display apparatus according to claim 1, wherein the signal processing circuit is further configured to:
control the drive ratio between the plurality of subpixels.

7. The display apparatus according to claim 6, wherein the signal processing circuit is further configured to calculate the drive ratio based on at least one of brightness information or luminosity information and based on saturation information of a respective pixel of the plurality of pixels obtained from the plurality of video signals.

8. The display apparatus according to claim 7, wherein the signal processing circuit is further configured to calculate the drive ratio based on at least one of average brightness or average luminosity and based on average saturation of the plurality of pixels.

9. The display apparatus according to claim 6, wherein
the signal processing is executed based on a multiplication of a first video signal of the plurality of video signals by (1.0–K),
the first video signal drives a first subpixel of the plurality of subpixels that has a first light emission spectrum,
the signal processing is executed based on a multiplication of a second video signal of the plurality of video signals by $(K \times L_b/L_a)$,
the second video signal drives a second subpixel of the plurality of subpixels that has a second light emission spectrum,
the first light emission spectrum is weaker than the second light emission spectrum, and
K is the drive ratio, $L_b$ is maximum brightness of the first subpixel, and $L_a$ is maximum brightness of the second subpixel.

10. The display apparatus according to claim 1, wherein the plurality of subpixels are mixed in a checker pattern in units of pixels of the plurality of pixels.

11. The display apparatus according to claim 1, wherein the first set of color filters alternates with the second set of color filters in a checker pattern in one unit of pixel.

12. An electronic appliance, comprising:
a display apparatus that comprises:
a plurality of pixels, wherein each pixel of the plurality of pixels comprises a plurality of units of subpixels, wherein each unit of subpixel of the plurality of units of subpixels comprises a plurality of subpixels in a matrix form, the plurality of subpixels have different light emission spectra of a plurality of light emission colors, and the plurality of subpixels are mixed in the plurality of units of subpixels of the plurality of subpixels;

a plurality of color filters associated with the plurality of units of subpixels, wherein each color filter of the plurality of color filters associated with each unit of subpixel of the plurality of units of subpixels has same optical density, an optical density of a first set of color filters of the plurality of color filters is greater than an optical density of a second set of color filters of the plurality of color filters, the first set of color filters are associated with a first unit of subpixel of the plurality of units of subpixels and the second set of color filters are associated with a second unit of subpixel of the plurality of units of subpixels, a first color filter of the first set of color filters is diagonally adjacent to a second color filter of the first set of color filters, and a third color filter of the second set of color filters is diagonally adjacent to a fourth color filter of the second set of color filters; and a signal processing circuit configured to execute signal processing on a plurality of video signals that drives the plurality of subpixels; and convert the plurality of video signals to a plurality of output video signals based on a conversion rate, wherein the conversion rate is a drive ratio between a first set of subpixels of the plurality of subpixels and a second set of subpixels, and the first set of subpixels are associated with the first set of color filters and the second set of subpixels are associated with the second set of color filters.

13. A display apparatus, comprising:

a plurality of pixels, wherein each pixel of the plurality of pixels comprises a plurality of subpixels in a matrix form, wherein the plurality of subpixels have different light emission spectra of a plurality of light emission colors, and the plurality of subpixels is mixed in one of units of pixels of the plurality of pixels or units of subpixels of the plurality of subpixels; and a signal processing circuit configured to:

execute signal processing on a plurality of video signals that drives the plurality of subpixels; and control a drive ratio between the plurality of subpixels, wherein the signal processing is executed based on a multiplication of a first video signal of the plurality of video signals by (1.0−K), the first video signal drives a first subpixel of the plurality of subpixels that has a first light emission spectrum, the signal processing is executed based on a multiplication of a second video signal of the plurality of video signals by $(K \times L_b/L_a)$, the second video signal drives a second subpixel of the plurality of subpixels that has a second light emission spectrum, the first light emission spectrum is weaker than the second light emission spectrum, and K is the drive ratio, $L_b$ is maximum brightness of the first subpixel, and $L_a$ is maximum brightness of the second subpixel.

* * * * *